United States Patent
Itou et al.

(10) Patent No.: US 12,249,676 B2
(45) Date of Patent: Mar. 11, 2025

(54) DISPLAY DEVICE

(71) Applicant: Japan Display Inc., Tokyo (JP)

(72) Inventors: Osamu Itou, Tokyo (JP); Masanobu Ikeda, Tokyo (JP); Masataka Ikeda, Tokyo (JP)

(73) Assignee: Japan Display Inc., Tokyo (JP)

( * ) Notice: Subject to any disclaimer, the term of this patent is extended or adjusted under 35 U.S.C. 154(b) by 874 days.

(21) Appl. No.: 17/316,927

(22) Filed: May 11, 2021

(65) Prior Publication Data

US 2021/0265533 A1     Aug. 26, 2021

Related U.S. Application Data

(63) Continuation of application No. PCT/JP2019/035445, filed on Sep. 10, 2019.

(30) Foreign Application Priority Data

Nov. 12, 2018   (JP) .................................. 2018-212415

(51) Int. Cl.
| | |
|---|---|
| *H01L 33/00* | (2010.01) |
| *H01L 25/16* | (2023.01) |
| *H01L 33/44* | (2010.01) |
| *H01L 33/46* | (2010.01) |
| *H01L 33/54* | (2010.01) |

(Continued)

(52) U.S. Cl.
CPC ............ *H01L 33/44* (2013.01); *H01L 25/167* (2013.01); *H01L 33/465* (2013.01); *H01L 33/54* (2013.01); *H01L 33/60* (2013.01); *H01L 33/62* (2013.01)

(58) Field of Classification Search
None
See application file for complete search history.

(56) References Cited

U.S. PATENT DOCUMENTS

| | | | |
|---|---|---|---|
| 5,847,506 | A | 12/1998 | Nakayama et al. |
| 6,320,206 | B1 | 11/2001 | Coman et al. |

(Continued)

FOREIGN PATENT DOCUMENTS

| | | | |
|---|---|---|---|
| JP | H08213174 | A | 8/1996 |
| JP | 2000228563 | A | 8/2000 |

(Continued)

OTHER PUBLICATIONS

International Search Report mailed Dec. 3, 2019 in connection with PCT/JP2019/035445.

(Continued)

*Primary Examiner* — Bradley Smith
(74) *Attorney, Agent, or Firm* — K&L Gates LLP

(57) ABSTRACT

A display device includes a substrate, a plurality of pixels, a light emitting element, and an inorganic insulating layer. The pixels are provided to the substrate. The light emitting element is provided to each of the pixels. The inorganic insulating layer has translucency and covers at least part of the light emitting element. The inorganic insulating layer includes a side part and an extending part. The side part is provided to the side surface of the light emitting element. The extending part is provided at a side on the lower end of the side part and extending toward the outer side of the light emitting element than the side part in planar view seen from the normal direction of the substrate.

7 Claims, 18 Drawing Sheets

(51) Int. Cl.
  *H01L 33/60* (2010.01)
  *H01L 33/62* (2010.01)

(56) References Cited

U.S. PATENT DOCUMENTS

| | | |
|---|---|---|
| 2002/0030198 A1 | 3/2002 | Coman et al. |
| 2009/0015141 A1 | 1/2009 | Wang et al. |
| 2009/0059404 A1 | 3/2009 | Wang et al. |
| 2013/0027623 A1 | 1/2013 | Negishi et al. |
| 2014/0353692 A1* | 12/2014 | Oh .................. H01L 27/15 257/88 |
| 2015/0280065 A1 | 10/2015 | Wada |
| 2016/0190396 A1* | 6/2016 | Lee .................. H01L 33/32 257/13 |
| 2017/0271618 A1 | 9/2017 | Kamiya |
| 2018/0166429 A1 | 6/2018 | Chong et al. |
| 2018/0226016 A1 | 8/2018 | Suzuki et al. |
| 2018/0323342 A1 | 11/2018 | Tsai et al. |
| 2020/0152693 A1* | 5/2020 | Zou .................. H01L 27/153 |
| 2020/0227601 A1* | 7/2020 | Zha .................. G02F 1/133606 |
| 2021/0167266 A1* | 6/2021 | Ikeda ................ H01L 33/62 |
| 2021/0384383 A1* | 12/2021 | He ................... H01L 33/20 |

FOREIGN PATENT DOCUMENTS

| | | |
|---|---|---|
| JP | 2000315062 A | 11/2000 |
| JP | 2008527626 A | 7/2008 |
| JP | 2008277651 A | 11/2008 |
| JP | 2011197347 A | 10/2011 |
| JP | 2014086533 A | 5/2014 |
| JP | 2015192100 A | 11/2015 |
| JP | 2016127289 A | 7/2016 |
| JP | 2017168411 A | 9/2017 |
| WO | 2017018059 A1 | 2/2017 |
| WO | 2017142817 A1 | 8/2017 |
| WO | WO-2018137139 A1 * | 8/2018 ............. H01L 25/18 |

OTHER PUBLICATIONS

Japanese Office Action issued Oct. 4, 2022 in corresponding Japanese Application No. 2018-212415.
Chinese Office Action issued Oct. 10, 2023 in corresponding Chinese Application No. 201980074302.4.

* cited by examiner

DISPLAY DEVICE

CROSS-REFERENCE TO RELATED APPLICATION(S)

This application is a continuation of PCT international application Ser. No. PCT/JP2019/035445 filed on Sep. 10, 2019 which designates the United States, incorporated herein by reference, and which claims the benefit of priority from Japanese Patent Application No. 2018-212415, filed on Nov. 12, 2018, incorporated herein by reference.

BACKGROUND

1. Technical Field

The present invention relates to a display device.

2. Description of the Related Art

Widely known are display devices including organic light emitting diodes (OLED) or inorganic light emitting diodes (micro LEDs) serving as display elements. Micro LEDs are suitably used as light emitting elements for display devices because they are small in size and have high luminance. The organic light emitting element described in Japanese Patent Application Laid-open Publication No. H8-213174 A includes a translucent reflective layer functioning as an optical resonator on the back surface of a light emitting layer.

Display devices including micro LEDs are expected to have higher light extraction efficiency. Japanese Patent Application Laid-open Publication No. H8-213174 A does not describe any configuration to increase the light extraction efficiency of the micro LEDs.

An object of the present invention is to provide a display device having higher light extraction efficiency.

SUMMARY

A display device according to an aspect of the present invention comprising: a substrate; a plurality of pixels provided to the substrate; a light emitting element provided to each of the pixels; and an inorganic insulating layer having translucency and covering at least part of the light emitting element, wherein the inorganic insulating layer includes: a side part provided to a side surface of the light emitting element; and an extending part provided at a side on a lower end of the side part and extending toward an outer side of the light emitting element than the side part in planar view seen from a normal direction of the substrate.

DETAILED DESCRIPTION OF THE PREFERRED EMBODIMENTS

Figure 1:
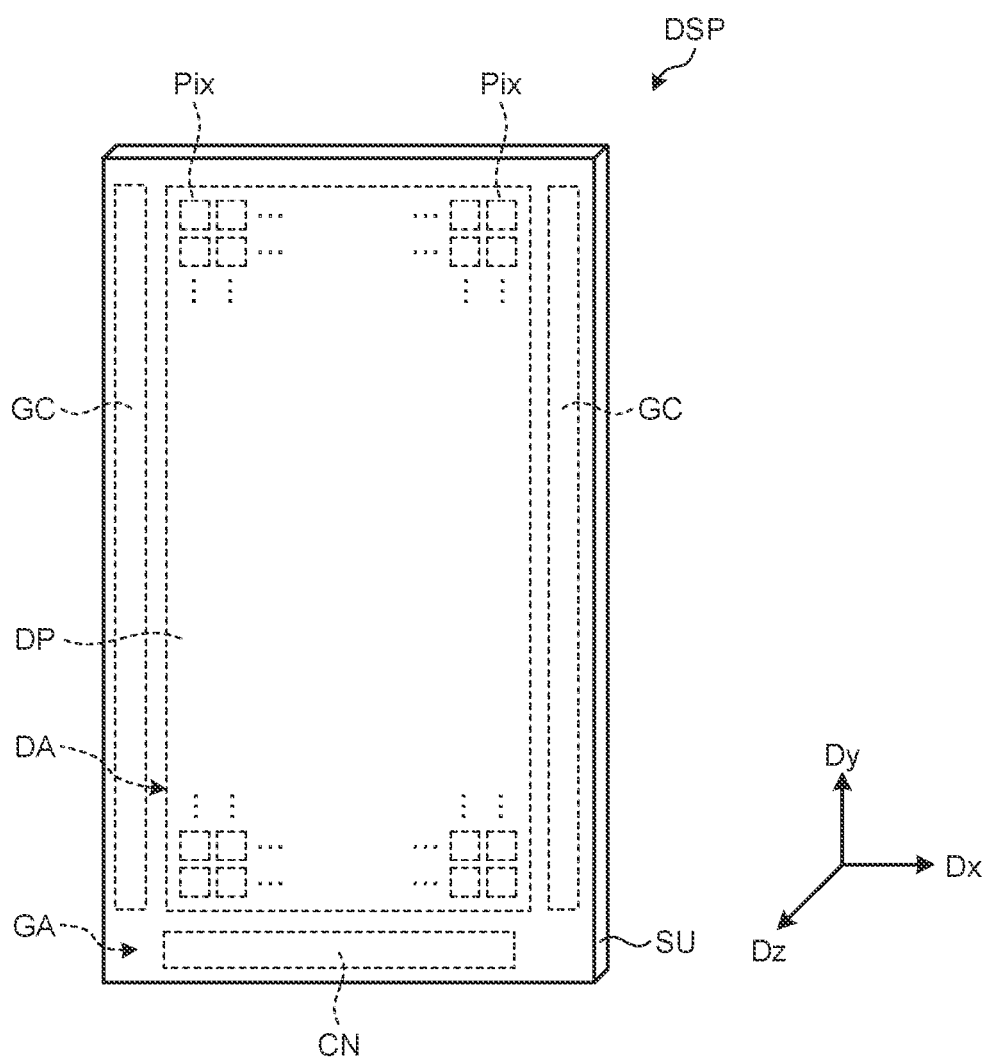
FIG. 1 is a perspective view schematically illustrating a display device according to a first embodiment.

Exemplary aspects (embodiments) to embody the present invention are described below in greater detail with reference to the accompanying drawings. The contents described in the embodiments are not intended to limit the present invention. Components described below include components easily conceivable by those skilled in the art and components substantially identical therewith. Furthermore, the components described below may be appropriately combined. What is disclosed herein is given by way of example only, and appropriate changes made without departing from the spirit of the present invention and easily conceivable by those skilled in the art naturally fall within the scope of the invention. To simplify the explanation, the drawings may possibly illustrate the width, the thickness, the shape, and other elements of each unit more schematically than the actual aspect. These elements, however, are given by way of example only and are not intended to limit interpretation of the present invention. In the present specification and the figures, components similar to those previously described with reference to previous figures are denoted by like reference numerals, and detailed explanation thereof may be appropriately omitted.

First Embodiment

FIG. 1 is a perspective view schematically illustrating a display device according to a first embodiment. As illustrated in FIG. 1, a display device DSP includes a substrate SU, pixels Pix, peripheral circuits GC, and a coupler CN. The substrate SU, a plurality of transistors, a plurality of capacitances, various kinds of wiring, and other components constitute an array substrate that drives the pixels Pix. The array substrate is a drive circuit board and is also called a backplane or an active matrix substrate. A drive integrated circuit (IC) is coupled to the array substrate via the coupler CN.

As illustrated in FIG. 1, the display device DSP has a display region DA and a peripheral region GA. The display region DA is disposed overlapping a display portion DP and displays an image. The peripheral region GA does not overlap the display portion DP and is disposed outside the display region DA.

The display portion DP includes a plurality of pixels Pix. The pixels Pix are arrayed in a first direction Dx and a second direction Dy in the display region DA. The first direction Dx and the second direction Dy are parallel to the surface of the substrate SU. The first direction Dx is orthogonal to the second direction Dy. The first direction Dx may intersect the second direction Dy without being orthogonal thereto. A third direction Dz is orthogonal to the first direction Dx and the second direction Dy. The third direction Dz corresponds to the normal direction of the substrate SU, for example. In the following description, planar view indicates the positional relation when viewed in the third direction Dz.

The peripheral circuits GC and the coupler CN are provided in the peripheral region GA. The peripheral circuits GC drive a plurality of gate lines (e.g., a reset control signal line RSL, an output control signal line MSL, a pixel control signal line SSL, and an initialization control signal line ISL (refer to FIG. 3)) based on various control signals received from the drive IC. The peripheral circuits GC sequentially or simultaneously select a plurality of gate lines and supply gate drive signals to the selected gate lines. As a result, the peripheral circuits GC select a plurality of pixels Pix coupled to the gate lines.

The drive IC is a circuit that controls display on the display device DSP. The drive IC may be mounted on FPCs or a rigid substrate coupled to the coupler CN of the substrate SU as chip on film (COF). The mounting form of the drive IC is not limited thereto, and the drive IC may be mounted on the peripheral region GA of the substrate SU as chip on glass (COG).

Figure 2:
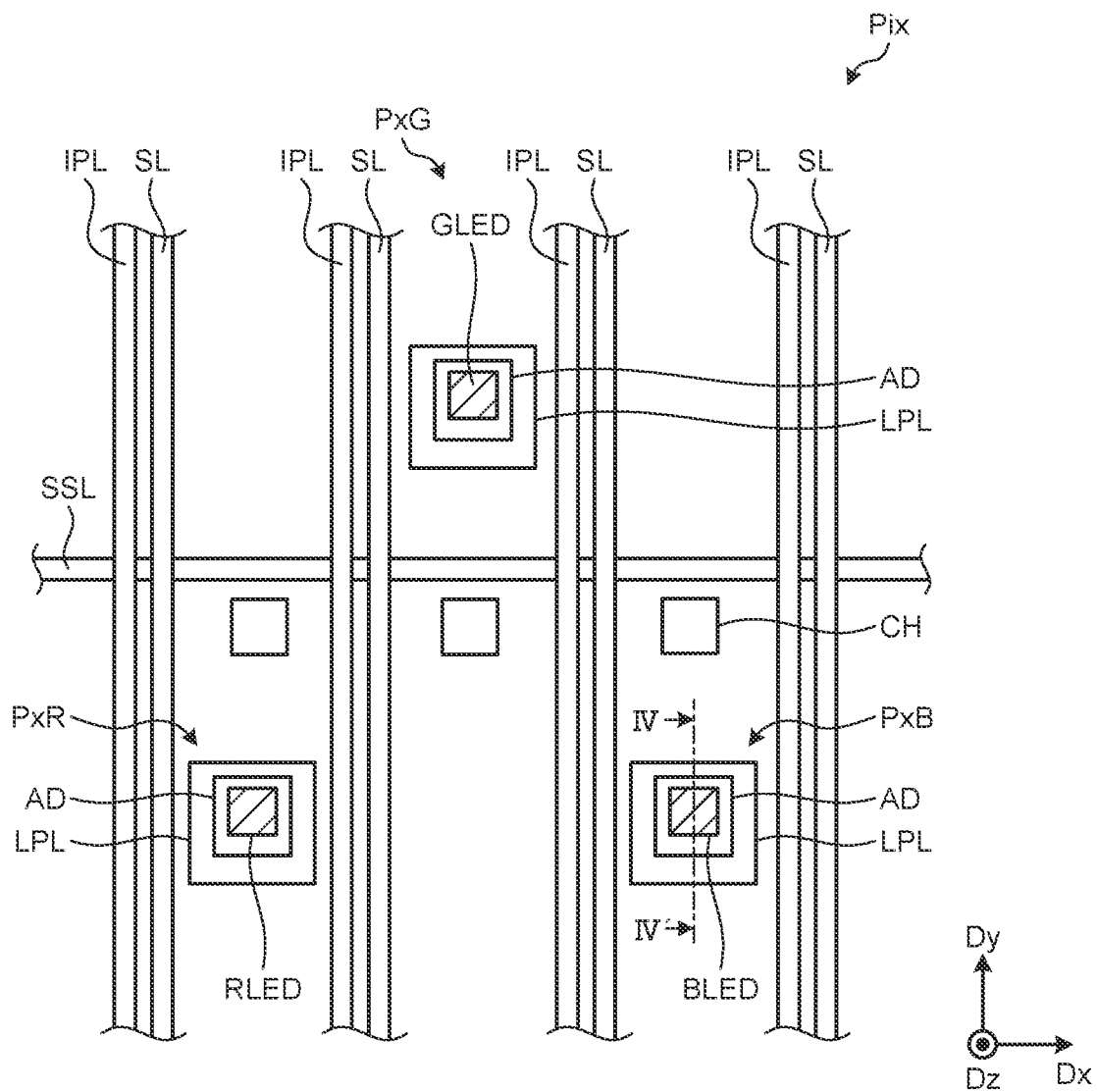
FIG. 2 is a plan view of a plurality of pixels.

FIG. 2 is a plan view of a plurality of pixels. As illustrated in FIG. 2, one pixel Pix includes a first pixel PxR, a second pixel PxG, and a third pixel PxB, for example. The first pixel PxR displays a primary color of red as the first color. The second pixel PxG displays a primary color of green as the second color. The third pixel PxB displays a primary color of blue as the third color. As illustrated in FIG. 2, the first pixel PxR, the second pixel PxG, and the third pixel PxB are disposed side by side in the first direction Dx in one pixel Pix. The first color, the second color, and the third color are not limited to red, green, and blue, respectively, and may be any desired colors, such as complementary colors. In the following description, the first pixel PxR, the second pixel PxG, and the third pixel PxB are referred to as pixels Px when they need not be distinguished from one another.

The pixels Px each include a light emitting element LED (RLED, GLED, or BLED), an anode electrode AD, and a light extraction layer LPL. FIG. 2 also illustrates video signal lines SL, anode power supply lines IPL, and a pixel control signal line SSL out of various kinds of wiring of a pixel circuit PICA. The video signal lines SL and the anode power supply lines IPL extend in the second direction Dy. A plurality of pairs of the video signal line SL and the anode power supply line IPL are disposed side by side in the first direction Dx. The pixel control signal line SSL extends in the first direction Dx and intersects the video signal lines SL and the anode power supply lines IPL in planar view. A contract hole CH is formed in a grid surrounded by the pairs of the video signal line SL and the anode power supply line IPL and the pixel control signal line SSL. A plurality of contact holes CH are arrayed in the first direction Dx.

The light emitting element RLED emits red light. The light emitting element GLED emits green light. The light emitting element BLED emits blue light. In FIG. 2, the light emitting element RLED and the light emitting element BLED are disposed on one side in the second direction Dy with respect to the array of the contact holes CH, and the light emitting element GLED is disposed on the other side in the second direction Dy. In other words, the contact holes CH and the pixel control signal line SSL are provided between the light emitting elements RLED and BLED and the light emitting element GLED. In the following description, the light emitting elements RLED, GLED, and BLED are referred to as light emitting elements LED when they need not be distinguished from one another.

The display device DSP displays an image by outputting different light from light emitting elements RLED, GLED, and BLED in the first pixel PxR, the second pixel PxG, and the third pixel PxB, respectively. The light emitting element LED is an inorganic light emitting diode (LED) chip having a size of approximately 3 μm to 100 μm in planar view and is called a micro LED. The display device DSP including the micro LEDs in the respective pixels is also called a micro LED display device. The term "micro" of the micro LED is not intended to limit the size of the light emitting element LED.

The light emitting elements LED may emit different light in four or more colors. The positions of the pixels Px and the light emitting elements LED are not limited to the configuration illustrated in FIG. 2. The light emitting elements RLED, GLED, and BLED may be disposed side by side in the first direction Dx. Alternatively, the light emitting element RLED and the light emitting element BLED may be disposed side by side in the first direction Dx, and the light emitting element GLED and the light emitting element BLED may be disposed side by side in the second direction Dy.

The light emitting element LED is coupled to the anode electrode AD. The light extraction layer LPL extends from the inside to the outside of the light emitting element LED in planar view and is provided around the light emitting element LED. The light extraction layer LPL outputs light output from the side surfaces of the light emitting element LED in the third direction Dz, that is, toward the display surface, thereby increasing the light extraction efficiency of the light emitting element LED.

Figure 3:
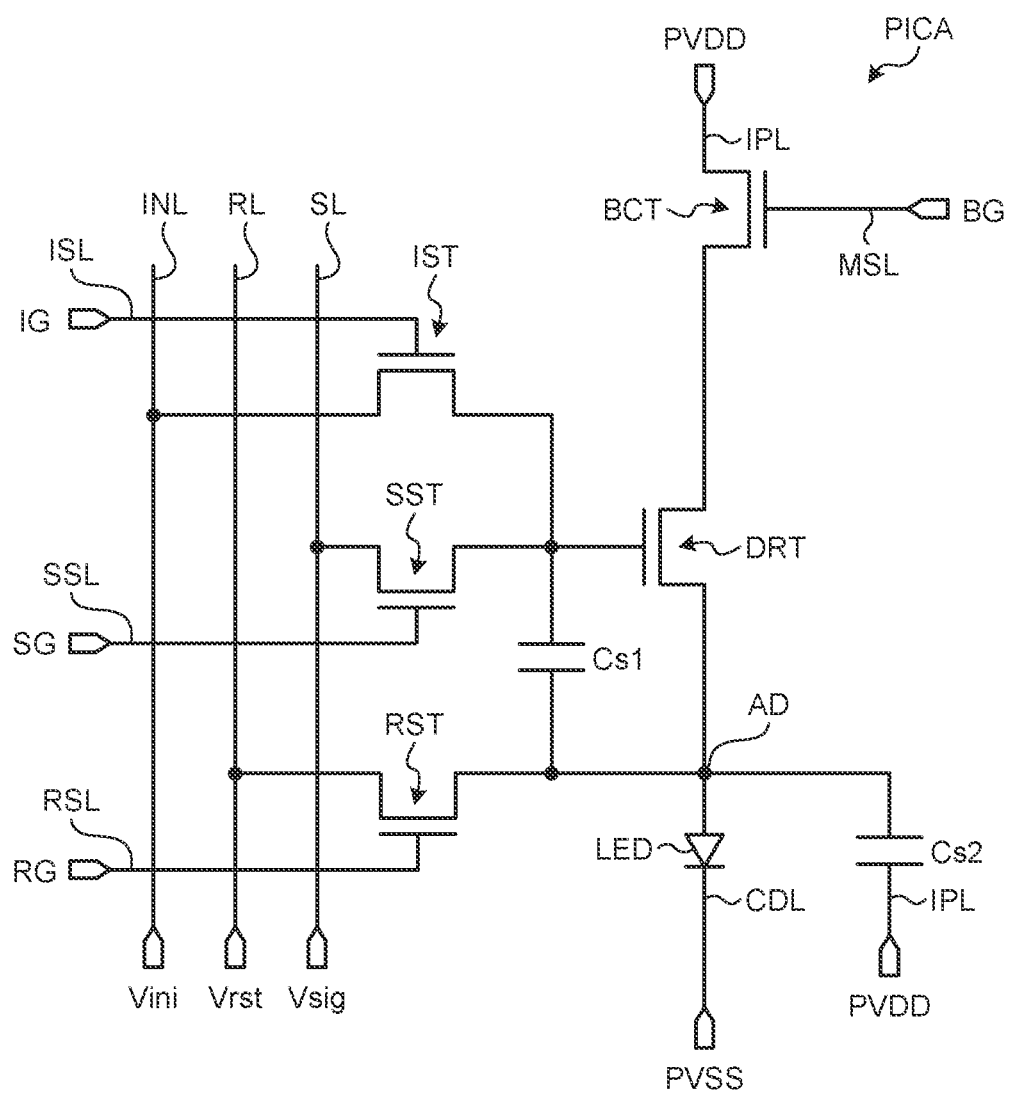
FIG. 3 is a circuit diagram of a pixel circuit.

FIG. 3 is a circuit diagram of a pixel circuit. FIG. 3 illustrates a pixel circuit PICA provided to one pixel Px. The pixel circuit PICA is provided to each of the pixels Px. As illustrated in FIG. 3, the pixel circuit PICA includes the light emitting element LED, five transistors, and two capacitances. Specifically, the pixel circuit PICA includes a drive transistor DRT, an output transistor BCT, an initialization transistor IST, a pixel selection transistor SST, and a reset transistor RST. The drive transistor DRT, the output transistor BCT, the initialization transistor IST, the pixel selection transistor SST, and the reset transistor RST are n-type thin-film transistors (TFTs). The pixel circuit PICA includes first capacitance Cs1 and second capacitance Cs2.

The cathode (cathode terminal ELED2 (refer to FIG. 5)) of the light emitting element LED is coupled to a cathode power supply line CDL. The anode (anode terminal ELED1 (refer to FIG. 5)) of the light emitting element LED is coupled to an anode power supply line IPL via the drive transistor DRT and the output transistor BCT. The anode power supply line IPL is supplied with an anode power supply potential PVDD. The cathode power supply line CDL is supplied with a cathode power supply potential PVSS. The anode power supply potential PVDD is higher than the cathode power supply potential PVSS.

The anode power supply line IPL supplies the anode power supply potential PVDD serving as a drive potential to the pixel Px. Specifically, the light emitting element LED emits light by being supplied with a forward current (drive current) by a potential difference (PVDD-PVSS) between the anode power supply potential PVDD and the cathode power supply potential PVSS. In other words, the anode power supply potential PVDD has a potential difference to cause the light emitting element LED to emit light with respect to the cathode power supply potential PVSS. The anode terminal ELED1 of the light emitting element LED is coupled to the anode electrode AD. The second capacitance Cs2 serving as an equivalent circuit is coupled between the anode electrode AD and the anode power supply line IPL.

The source electrode of the drive transistor DRT is coupled to the anode terminal ELED1 of the light emitting element LED via the anode electrode AD, and the drain electrode thereof is coupled to the source electrode of the output transistor BCT. The gate electrode of the drive transistor DRT is coupled to the first capacitance Cs1, the drain electrode of the pixel selection transistor SST, and the drain electrode of the initialization transistor IST.

The gate electrode of the output transistor BCT is coupled to the output control signal line MSL. The output control signal line MSL is supplied with an output control signal BG. The drain electrode of the output transistor BCT is coupled to the anode power supply line IPL.

The source electrode of the initialization transistor IST is coupled to an initialization power supply line INL. The initialization power supply line INL is supplied with an initialization potential *Vini*. The gate electrode of the initialization transistor IST is coupled to the initialization control signal line ISL. The initialization control signal line ISL is supplied with an initialization control signal IG. In other words, the gate electrode of the drive transistor DRT is coupled to the initialization power supply line INL via the initialization transistor IST.

The source electrode of the pixel selection transistor SST is coupled to a video signal line SL. The video signal line SL is supplied with a video signal Vsig. The gate electrode of the pixel selection transistor SST is coupled to the pixel control signal line SSL. The pixel control signal line SSL is supplied with a pixel control signal SG.

The source electrode of the reset transistor RST is coupled to a reset power supply line RL. The reset power supply line RL is supplied with a reset power supply potential Vrst. The gate electrode of the reset transistor RST is coupled to the reset control signal line RSL. The reset control signal line RSL is supplied with a reset control signal RG. The drain electrode of the reset transistor RST is coupled to the anode terminal ELED1 of the light emitting element LED and the source electrode of the drive transistor DRT.

The first capacitance Cs1 serving as an equivalent circuit is provided between the drain electrode of the reset transistor RST and the gate electrode of the drive transistor DRT. The pixel circuit PICA can prevent fluctuations in the gate voltage due to parasitic capacitance and current leakage in the drive transistor DRT by the first capacitance Cs1 and the second capacitance Cs2.

The gate electrode of the drive transistor DRT is supplied with an electric potential corresponding to the video signal Vsig (or gradation signal). In other words, the drive transistor DRT supplies an electric current corresponding to the video signal Vsig to the light emitting element LED based on the anode power supply potential PVDD supplied via the output transistor BCT. As described above, the anode power supply potential PVDD supplied to the anode power supply line IPL is lowered by the drive transistor DRT and the output transistor BCT. As a result, an electric potential lower than the anode power supply potential PVDD is supplied to the anode terminal ELED1 of the light emitting element LED.

A first electrode of the second capacitance Cs2 is supplied with the anode power supply potential PVDD via the anode power supply line IPL, and a second electrode of the second capacitance Cs2 is supplied with an electric potential lower than the anode power supply potential PVDD. In other words, the first electrode of the second capacitance Cs2 is supplied with an electric potential higher than that supplied to the second electrode of the second capacitance Cs2. The first electrode of the second capacitance Cs2 is the anode power supply line IPL, for example. The second electrode of the second capacitance Cs2 is the anode electrode AD of the drive transistor DRT and an anode coupling electrode coupled to the anode electrode AD, for example.

In the display device DSP, the peripheral circuits GC (illustrated in FIG. 1) select a plurality of pixel rows in order from the first row (e.g., the uppermost pixel row in the display region DA in FIG. 1). The drive IC writes the video signals Vsig (video writing potential) to the pixels Px of the selected pixel row, thereby causing the light emitting elements LED to emit light. The drive IC supplies the video signals Vsig to the video signal line SL, supplies the reset power supply potential Vrst to the reset power supply line RL, and supplies the initialization potential Vini to the initialization power supply line INL in each horizontal scanning period. The display device DSP repeats these operations in units of an image of one frame.

The configuration of the pixel circuit PICA illustrated in FIG. 3 may be appropriately modified. The number of wires and the number of transistors in one pixel Px may be different from those illustrated in FIG. 3, for example. The pixel circuit PICA may be a current mirror circuit, for example.

Figure 4:
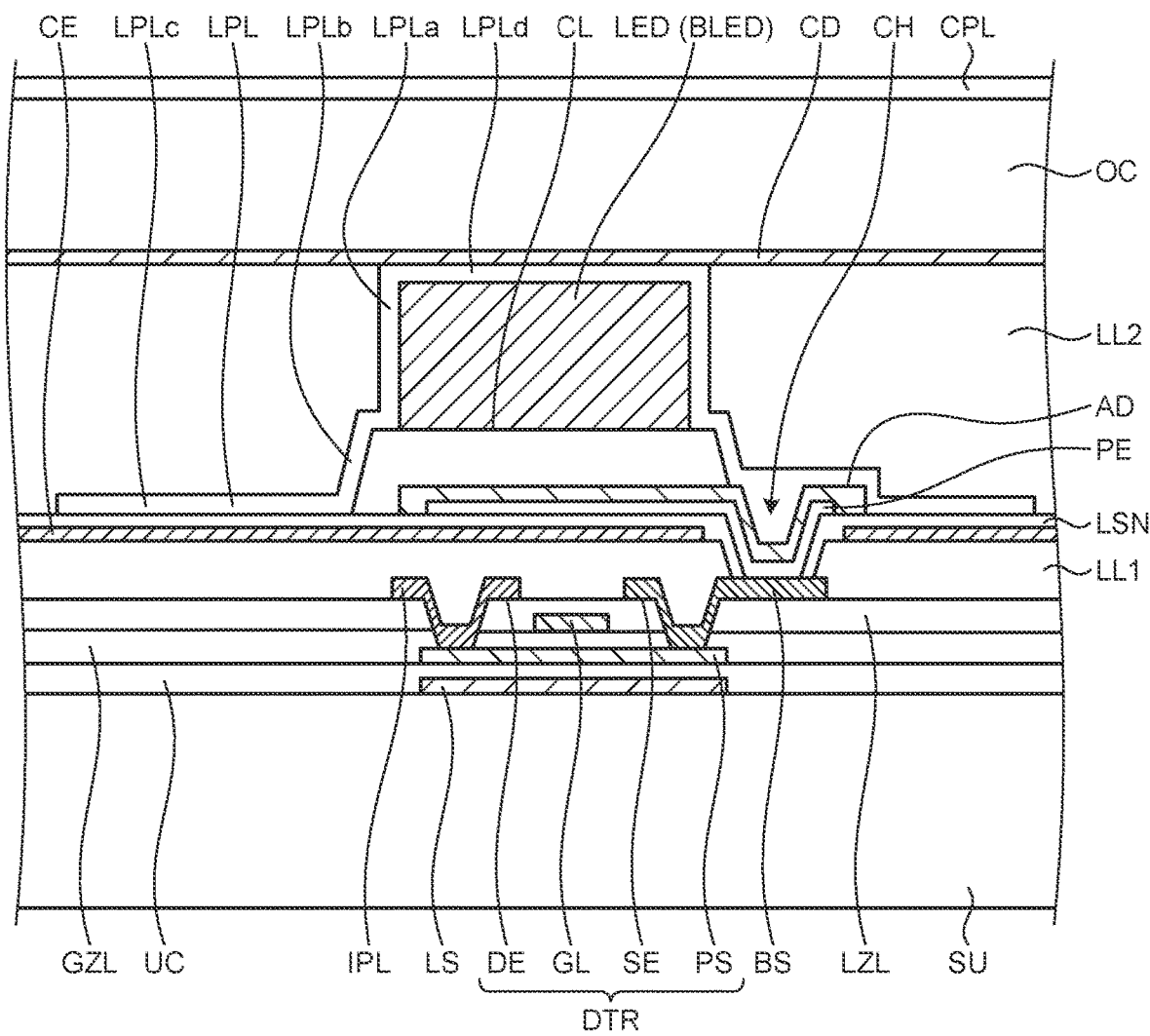
FIG. 4 is a sectional view along line IV-IV' of FIG. 2.
Figure 5:
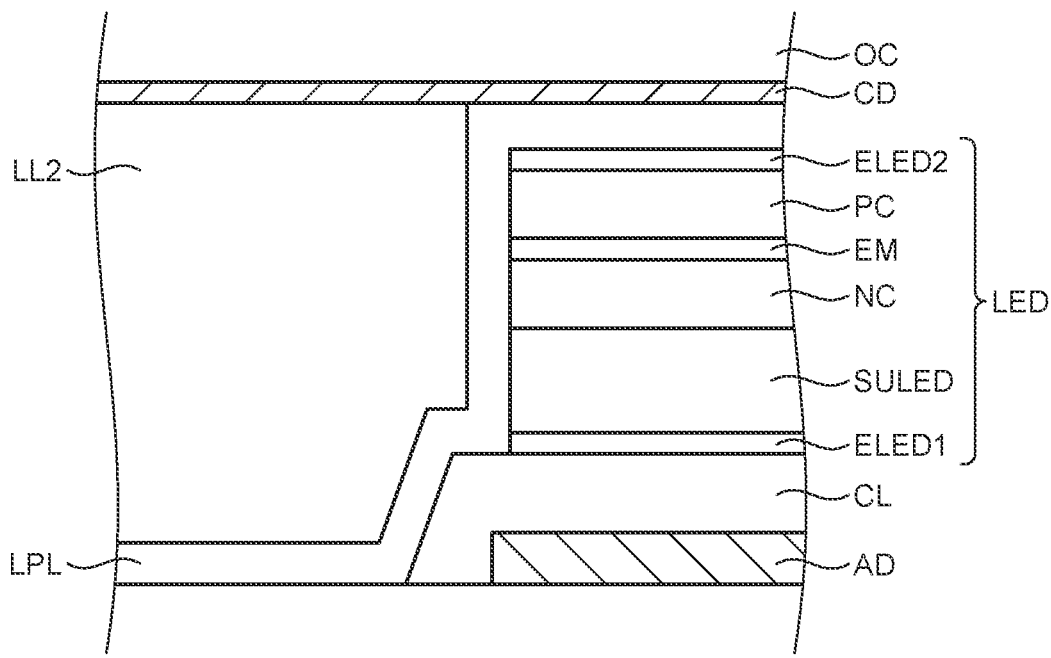
FIG. 5 is an enlarged sectional view of a light emitting element illustrated in FIG. 4.
Figure 6:
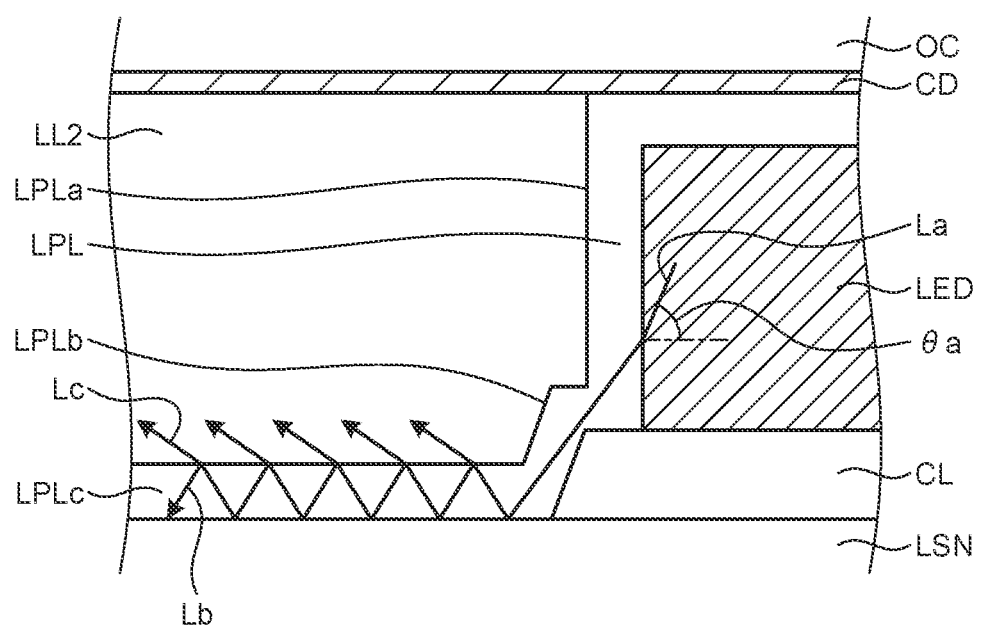
FIG. 6 is a view for explaining a state where light output from the light emitting element propagates in a light extraction layer.

The following describes a specific configuration example of the light emitting element LED and the light extraction layer LPL with reference to FIGS. 4 to 6. FIG. 4 is a sectional view along line IV-IV' of FIG. 2.

As illustrated in FIG. 4, the light emitting element LED is provided on the substrate SU. The substrate SU is an insulating substrate and is a glass substrate, a resin substrate, or a resin film, for example. The substrate SU is made of borosilicate glass having a thickness of 100 μm, for example.

In the present specification, a direction from the substrate SU to an overcoat layer OC in a direction perpendicular to the surface of the substrate SU is defined as an "upper side". A direction from the overcoat layer OC to the substrate SU is defined as a "lower side".

The drive transistor DTR is provided on a first surface of the substrate SU. FIG. 4 illustrates the drive transistor DTR out of the transistors of the pixel circuit PICA. The output transistor BCT, the initialization transistor IST, the pixel selection transistor SST, and the reset transistor RST are also provided on the first surface of the substrate SU. Explanation of the multilayered structure of the output transistor BCT, the initialization transistor IST, the pixel selection transistor SST, and the reset transistor RST is omitted herein because they have a configuration similar to that of the drive transistor DTR.

Various layers are provided on the first surface of the substrate SU in order of a light-shielding layer LS, an undercoat layer UC, a semiconductor layer PS, a gate insulating film GZL, scanning wiring GL, an interlayer insulating film LZL, the anode power supply line IPL and a base BS, a first flattening layer LL1, a common electrode CE, a capacitance nitride film LSN, a pixel electrode PE, the anode electrode AD, a coupling layer CL, the light emitting element LED, the light extraction layer LPL, a second flattening layer LL2, a cathode electrode CD, the overcoat layer OC, and a circularly polarizing plate CPL.

The light-shielding layer LS is a molybdenum tungsten (MoW) alloy film having a layer thickness of approximately 50 nm. The light-shielding layer LS is made of material having lower light transmittance than that of the substrate SU and provided under the semiconductor layer PS. The undercoat layer UC is a multilayered body composed of a silicon nitride (SiN) layer and a silicon oxide ($SiO_2$) layer. The layer thickness of the silicon nitride layer is approximately 100 nm, and that of the silicon oxide layer is approximately 150 nm. The semiconductor layer PS is made of polycrystalline silicon, for example, and is produced by polycrystallizing an amorphous silicon layer by laser annealing. The layer thickness of the semiconductor layer PS is approximately 50 nm, for example.

The gate insulating film GZL is a silicon oxide film having a layer thickness of approximately 100 nm. The scanning wiring GL is a molybdenum tungsten alloy film having a layer thickness of approximately 300 nm. The scanning wiring GL is wiring with which the drain line of the pixel selection transistor SST and the drain line of the initialization transistor IST merge. The gate insulating film GZL is provided between the semiconductor layer PS and the scanning wiring GL in the normal direction of the substrate SU. The interlayer insulating film LZL is a multilayered body composed of a silicon oxide layer and a silicon nitride layer. The layer thickness of the silicon oxide layer is approximately 350 nm, and that of the silicon nitride layer is approximately 375 nm.

The anode power supply line IPL and the base BS are provided in the same layer and are three-layer films composed of titanium (Ti), aluminum (Al), and titanium (Ti). The layer thicknesses of the respective layers are approximately 100 nm, 400 nm, and 200 nm. The part of the anode power supply line IPL overlapping the semiconductor layer PS functions as a drain electrode DE of the drive transistor DTR. The part of the base BS overlapping the semiconductor layer PS functions as a source electrode SE of the drive transistor DTR. The drain electrode DE and the source electrode SE are each coupled to the semiconductor layer PS through a contact hole formed in the interlayer insulating film LZL and the gate insulating film GZL.

The first flattening layer LL1 and the second flattening layer LL2 are organic insulating films. The layer thickness of the first flattening layer LL1 is approximately 2 m, and the layer thickness of the second flattening layer LL2 is approximately 10 m. The first flattening layer LL1 is provided on the interlayer insulating film LZL to cover the anode power supply line IPL and the base BS. The common electrode CE, the pixel electrode PE, and the cathode electrode CD are made of indium tin oxide (ITO). The layer thickness of the common electrode CE is approximately 50 nm, that of the pixel electrode PE is approximately 50 nm, and that of the cathode electrode CD is approximately 100 nm. The capacitance nitride film LSN is a silicon nitride layer produced by low-temperature deposition and has a layer thickness of approximately 120 nm. The capacitance nitride film LSN is provided between the common electrode CE and the pixel electrode PE in the normal direction of the substrate SU.

The anode electrode AD is a multilayered body composed of ITO, silver (Ag), and ITO. The anode electrode AD is provided on the pixel electrode PE and coupled to the base BS through the contact hole CH formed in the first flattening layer LL1. The coupling layer CL is made of silver paste and provided on the anode electrode AD between the substrate SU and the light emitting element LED. The light emitting element LED is provided on and electrically coupled to the coupling layer CL. In other words, the light emitting element LED is electrically coupled to the anode electrode AD via the coupling layer CL. The overcoat layer OC is a multilayered body composed of a silicon nitride film having a layer thickness of 200 nm and an organic insulating film having a layer thickness of 10 m.

The material and the layer thickness of the layers are given by way of example only and may be appropriately modified. The semiconductor layer PS, for example, is not necessarily made of polycrystalline silicon and may be made of amorphous silicon, microcrystalline oxide semiconductor, amorphous oxide semiconductor, low-temperature polycrystalline silicon (LTPS), or gallium nitride (GaN). Examples of the oxide semiconductor include, but are not limited to, IGZO, zinc oxide (ZnO), ITZO, etc. IGZO is indium gallium zinc oxide, and ITZO is indium tin zinc oxide. In the example illustrated in FIG. 4, the drive transistor DTR has what is called a top-gate structure. The drive transistor DTR may have a bottom-gate structure in which the gate electrode is provided under the semiconductor layer PS. Alternatively, the drive transistor DTR may have a dual-gate structure in which the gate electrodes are provided both on and under the semiconductor layer PS.

The light extraction layer LPL is provided on the capacitance nitride film LSN to cover the light emitting element LED, the coupling layer CL, the anode electrode AD, and the pixel electrode PE. The light extraction layer LPL is a translucent inorganic insulating layer and is a titanium oxide layer having a layer thickness of 300 nm, for example. The light extraction layer LPL can be formed by chemical vapor deposition (CVD) after the light emitting element LED is disposed on the coupling layer CL.

The light extraction layer LPL covers at least part of the light emitting element LED. The light extraction layer LPL covers the upper surface and the side surfaces of the light emitting element LED and is provided around the light emitting element LED. Specifically, the light extraction layer LPL includes a side part LPLa, an inclining part LPLb, an extending part LPLc, and a top part LPLd. The side part LPLa is provided surrounding the side surfaces of the light emitting element LED. The inclining part LPLb is coupled to the lower end of the side part LPLa and provided between the side part LPLa and the extending part LPLc. The inclining part LPLb is provided along the side surfaces of the coupling layer CL and inclines with respect to the side part LPLa.

The extending part LPLc is provided on the capacitance nitride film LSN and coupled to the lower end of the inclining part LPLb. In other words, the extending part LPLc is provided at a side on the lower end of the side part LPLa and extends toward the outer side of the light emitting element LED than the side part LPLa in planar view, that is, in a direction away from the side surfaces of the light emitting element LED. The top part LPLd is coupled to the upper end of the side part LPLa and provided on the upper surface of the light emitting element LED. In other words, the top part LPLd is provided between the upper surface of the light emitting element LED and the cathode electrode CD.

The second flattening layer LL2 is provided on the capacitance nitride film LSN to cover the side surfaces of the light emitting element LED, the side part LPLa, the inclining part LPLb, and the extending part LPLc. The cathode electrode CD is provided on the second flattening layer LL2 and the top part LPLd and electrically coupled to the cathode terminal ELED2 of the light emitting element LED. The cathode electrode CD is provided on the whole surface of the display region DA and electrically coupled to the cathode terminals ELED2 of the light emitting elements LED.

The following describes the configuration of the light emitting element LED. FIG. 5 is an enlarged sectional view of the light emitting element illustrated in FIG. 4. As illustrated in FIG. 5, the light emitting element LED includes a light emitting element substrate SULED, an n-type cladding layer NC, a light emitting layer EM, a p-type cladding layer PC, the anode terminal ELED1, and the cathode terminal ELED2. The n-type cladding layer NC, the light emitting layer EM, the p-type cladding layer PC, and the cathode terminal ELED2 are stacked in order on the light emitting element substrate SULED. The anode terminal ELED1 is provided between the light emitting element substrate SULED and the coupling layer CL.

In the light emitting element BLED that outputs blue light, the light emitting layer EM is made of indium gallium nitride (InGaN). The composition ratio of indium to gallium is 0.2:0.8, for example. The p-type cladding layer PC and the n-type cladding layer NC are made of gallium nitride (GaN). The light emitting element substrate SULED is made of silicon carbide (SiC).

In the light emitting element GLED that outputs green light, the light emitting layer EM is made of indium gallium nitride (InGaN). The composition ratio of indium to gallium is 0.45:0.55, for example. The p-type cladding layer PC and the n-type cladding layer NC are made of gallium nitride (GaN). The light emitting element substrate SULED is made of silicon carbide (SiC).

In the light emitting element RLED that outputs red light, the light emitting layer EM is made of aluminum gallium indium (AlGaIn). The composition ratio among aluminum, gallium, and indium is 0.225:0.275:0.5, for example. The p-type cladding layer PC and the n-type cladding layer NC are made of aluminum indium phosphide (AlInP). The light emitting element substrate SULED is made of gallium arsenide (GaAs).

Both the anode terminal ELED1 and the cathode terminal ELED2 of the light emitting elements RLED, GLED, and BLED are made of aluminum.

The maximum emission wavelengths of the light emitting elements RLED, GLED, and BLED are 645 nm, 530 nm, and 450 nm, respectively.

In the manufacturing process for the light emitting elements LED, a manufacturing apparatus forms the n-type cladding layer NC, the light emitting layer EM, the p-type cladding layer PC, and the cathode terminal ELED2 on the light emitting element substrate SULED. Subsequently, the manufacturing apparatus thins the light emitting element substrate SULED and forms the anode terminal ELED1 on the bottom surface of the light emitting element substrate SULED. The manufacturing apparatus then disposed the light emitting element LED cut into a rectangular shape on the coupling layer CL.

The coupling layer CL made of silver paste adheres to and is electrically coupled to the light emitting element LED while being deformed depending on force when the light emitting element LED is disposed. Alternatively, the coupling layer CL may be made of the same metal material as that of the anode terminal ELED1, such as aluminum. In this case, the light emitting element LED is disposed on the coupling layer CL and then subjected to heating, whereby the anode terminal ELED1 and the coupling layer CL are integrated. As a result, the coupling layer CL is favorably electrically coupled to the light emitting element LED.

FIG. 6 is a view for explaining a state where light output from the light emitting element propagates in the light extraction layer. A total reflection angle θr indicates the likelihood of incident of light La emitted from the light emitting element LED on an adjacent layer. The total reflection angle θr is an incident angle at which the light La generated in the light emitting element LED is totally reflected by the interface with the adjacent layer. As illustrated in FIG. 6, an incident angle θa of the light La on the side part LPLa is an angle formed by the normal direction of the side surface of the light emitting element LED and the traveling direction of the light La. If the incident angle θa is equal to or smaller than the total reflection angle θr, transmitted components are generated. As the total reflection angle θr is larger, the light La is more likely to be incident on the adjacent layer.

When the refractive index of the light emitting element LED is $n_{LED}$, and the refractive index of the adjacent layer is $n_{AJ}$, the total reflection angle θr is expressed by Expression (1):

$$\theta r = \arcsin(n_{AJ}/n_{LED}) \quad (1)$$

If $n_{AJ} > n_{LED}$ is satisfied, the light La can be incident on the adjacent layer at all the incident angles θa. If $n_{AJ} < n_{LED}$ is satisfied, the total reflection angle θr increases as $n_{AJ}$ increases. As a result, the component of the light La incident on the adjacent layer increases.

The side part LPLa of the light extraction layer LPL according to the present embodiment is provided between the side surface of the light emitting element LED and the second flattening layer LL2. The refractive index $n_{LED}$ of the light emitting element LED is 2.4, and the refractive index of the second flattening layer LL2 is 1.5, for example. The refractive index $n_{AJ}$ of the light extraction layer LPL is approximately 2.4 and is larger than the refractive index of the second flattening layer LL2. In other words, the difference between the refractive index of the light extraction layer LPL and the refractive index $n_{LED}$ of the light emitting element LED is smaller than the difference between the refractive index of the second flattening layer LL2 and the refractive index of the light emitting element LED. Consequently, the present embodiment has a larger total reflection angle θr at the interface between the light emitting element LED and the side part LPLa than in the case where the second flattening layer LL2 is provided in contact with the side surface of the light emitting element LED. As a result, the light La emitted from the light emitting element LED is more likely to be incident on the side surface LPLa. While the refractive index $n_{LED}$ of the light emitting element LED is equal to the refractive index $n_{AJ}$ of the light extraction layer LPL, they may be different from each other.

The inclining part LPLb is provided between the side part LPLa and the extending part LPLc. The angle formed by the side part LPLa and the inclining part LPLb and the angle formed by the extending part LPLc and the inclining part LPLb are gentler than in the case where the side part LPLa and the extending part LPLc are directly connected. This structure favorably guides light Lb incident on the side part LPLa to the extending part LPLc via the inclining part LPLb.

The second flatting layer LL2 is provided on the extending part LPLc, and the capacitance nitride film LSN is provided under the extending part LPLc. The refractive index of the capacitance nitride film LSN is 1.9, for example. In other words, the refractive index of the extending part LPLc is larger than those of the second flattening layer LL2 and the capacitance nitride film LSN. As a result, the light Lb propagates in a direction away from the light emitting element LED while being reflected inside the extending part LPLc. If the incident angle of the light Lb becomes smaller than the total reflection angle of the interface between the extending part LPLc and the second flattening layer LL2 in the propagation process, light Lc is output upward. With the light extraction layer LPL, the present embodiment can output the light La emitted from the light emitting element LED through the whole surface of the light extraction layer LPL. Consequently, the display device DSP has higher light extraction efficiency.

In addition, the light extraction layer LPL can cause the light Lb to propagate therethrough. Providing the respective light extraction layers LPL to the first pixel PxR, the second pixel PxG, and the third pixel PxB (refer to FIG. 2) can prevent color mixture in the light emitting elements LED.

While the light extraction layer LPL is a titanium oxide layer, for example, the material of the light extraction layer LPL is not limited thereto. The light extraction layer LPL is preferably made of translucent material having high refractive index. Examples of the material of the light extraction layer LPL include, but are not limited to, tantalum oxide, niobium oxide, barium titanium oxide, siloxane, etc. The thickness of the light extraction layer LPL is given by way of example only and may be appropriately modified. An ultraviolet absorption layer may be provided between the overcoat layer OC and the circularly polarizing plate CPL. If the light extraction layer LPL is made of titanium oxide, the second flattening layer LL2 may possibly photodegrade because titanium oxide absorbs ultraviolet rays. Providing an ultraviolet absorption layer can reduce the amount of ultraviolet rays incident on the second flattening layer LL2 and prevent photodegradation.

First Modification of the First Embodiment

Figure 7:
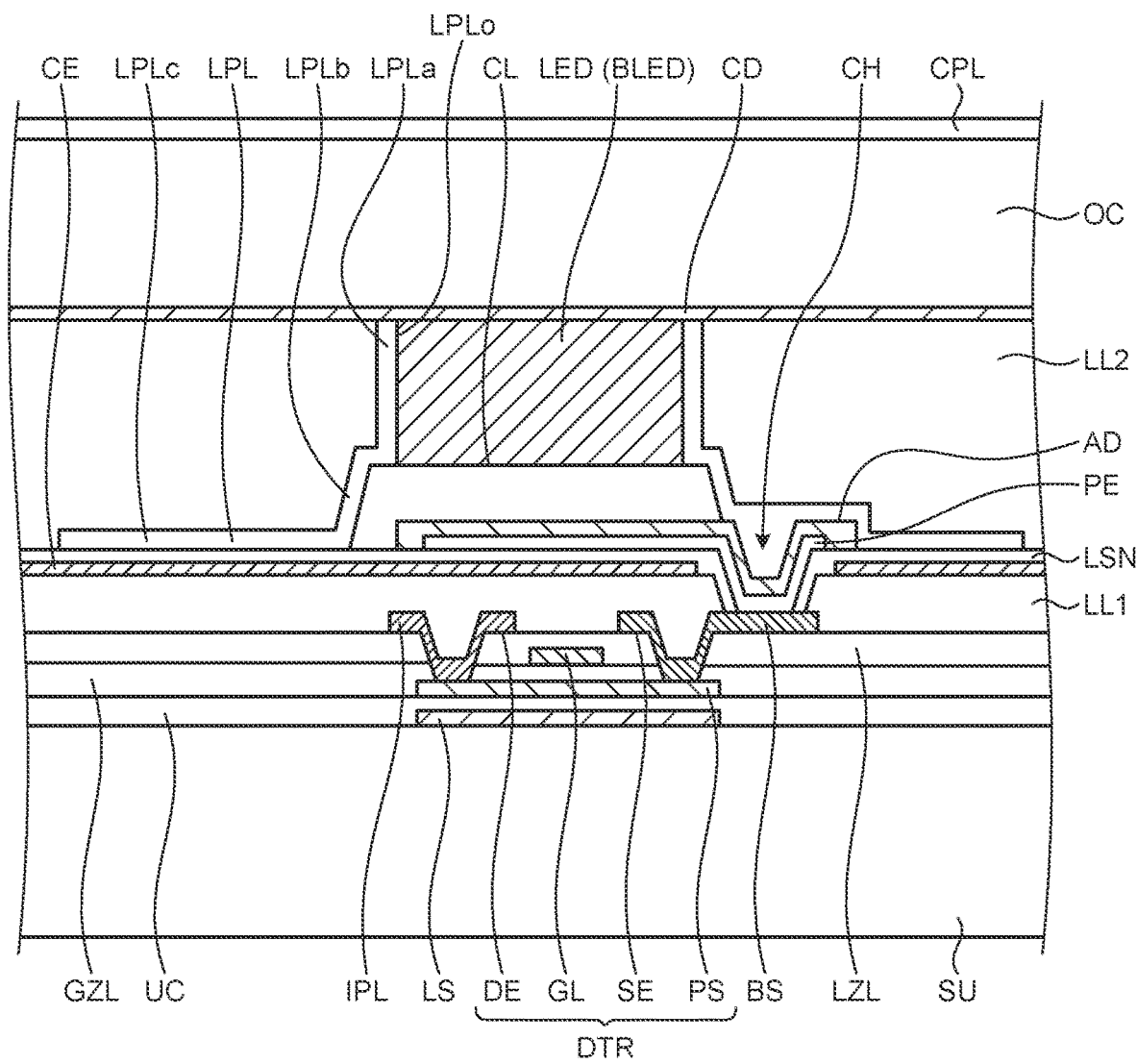
FIG. 7 is a sectional view of the display device according to a first modification of the first embodiment.

FIG. 7 is a sectional view of the display device according to a first modification of the first embodiment. In the following description, the components described in the embodiment above are denoted by like reference numerals, and explanation thereof is omitted.

As illustrated in FIG. 7, the light extraction layer LPL according to the first modification does not include the top part LPLd. In other words, the light extraction layer LPL includes the side part LPLa, the inclining part LPLb, and the extending part LPLc and has an opening LPLo at a part overlapping the upper surface of the light emitting element LED. The upper surface of the light emitting element LED is directly in contact with the cathode electrode CD in the opening LPLo. In other words, the cathode terminal ELED2 (refer to FIG. 5) of the light emitting element LED is directly in contact with the cathode electrode CD. With this configuration, the first modification can reduce coupling resistance between the cathode terminal ELED2 and the cathode electrode CD, thereby decreasing the drive voltage (anode power supply potential PVDD).

Second Modification of the First Embodiment

Figure 8:
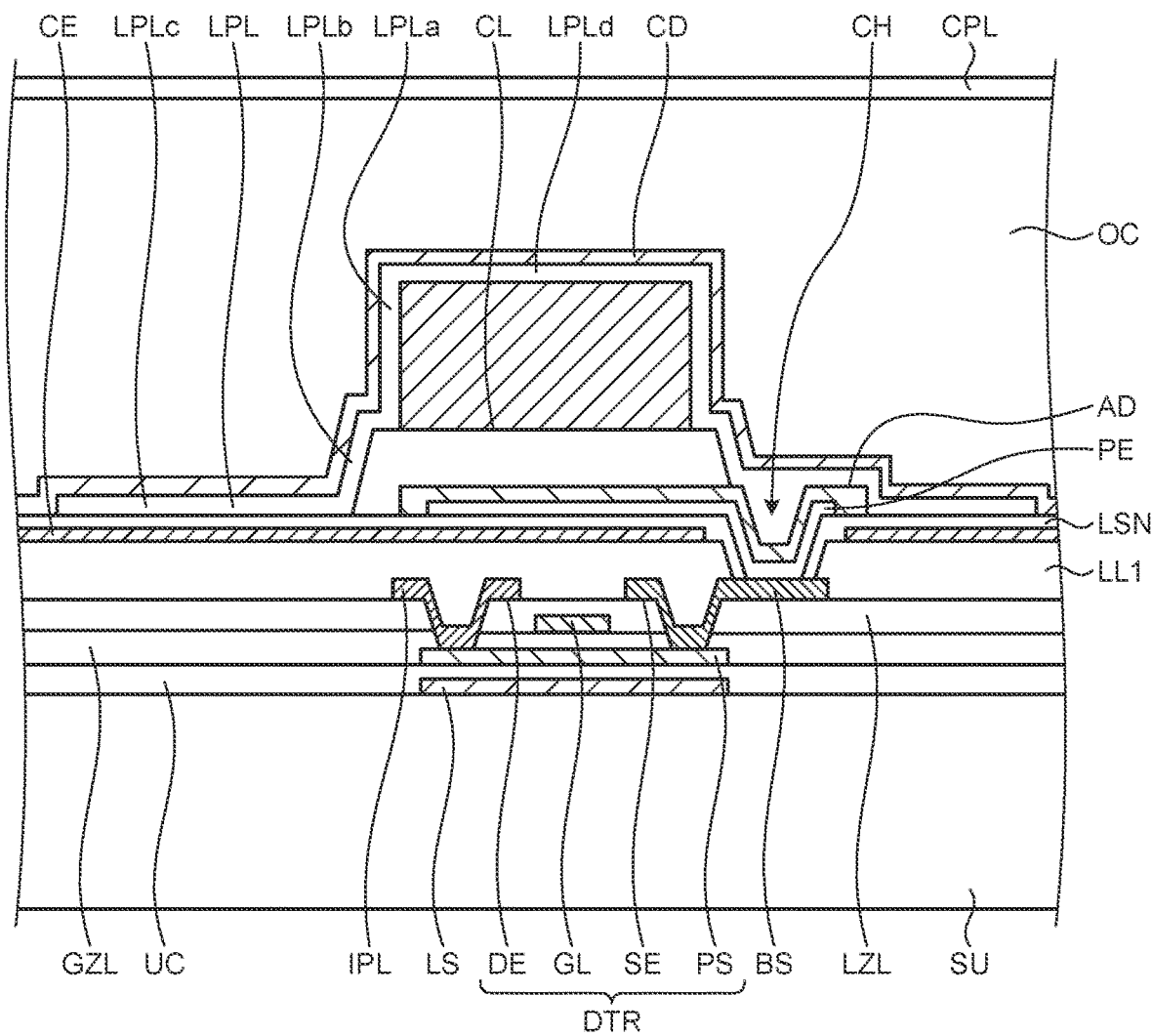
FIG. 8 is a sectional view of the display device according to a second modification of the first embodiment.

FIG. 8 is a sectional view of the display device according to a second modification of the first embodiment. As illustrated in FIG. 8, the cathode electrode CD according to the second modification is provided on the capacitance nitride film LSN to cover the light extraction layer LPL. Specifically, the cathode electrode CD is in contact with the whole surface of the light extraction layer LPL and is provided overlapping the side part LPLa, the inclining part LPLb, the extending part LPLc, and the top part LPLd. Also in the second modification, the cathode electrode CD is electrically coupled to the cathode terminals ELED2 of the light emitting elements LED.

The overcoat layer OC and the circularly polarizing plate CPL are provided on the cathode electrode CD. The overcoat layer OC is provided covering the side surfaces and the upper surface of the light emitting element LED and formed higher than the light emitting element LED so as to flatten the upper surface. The second modification does not require the second flattening layer LL2 unlike the first embodiment and the first modification. Consequently, the display device DSP according to the second modification can be manufactured at a lower cost.

Third Modification of the First Embodiment

Figure 9:
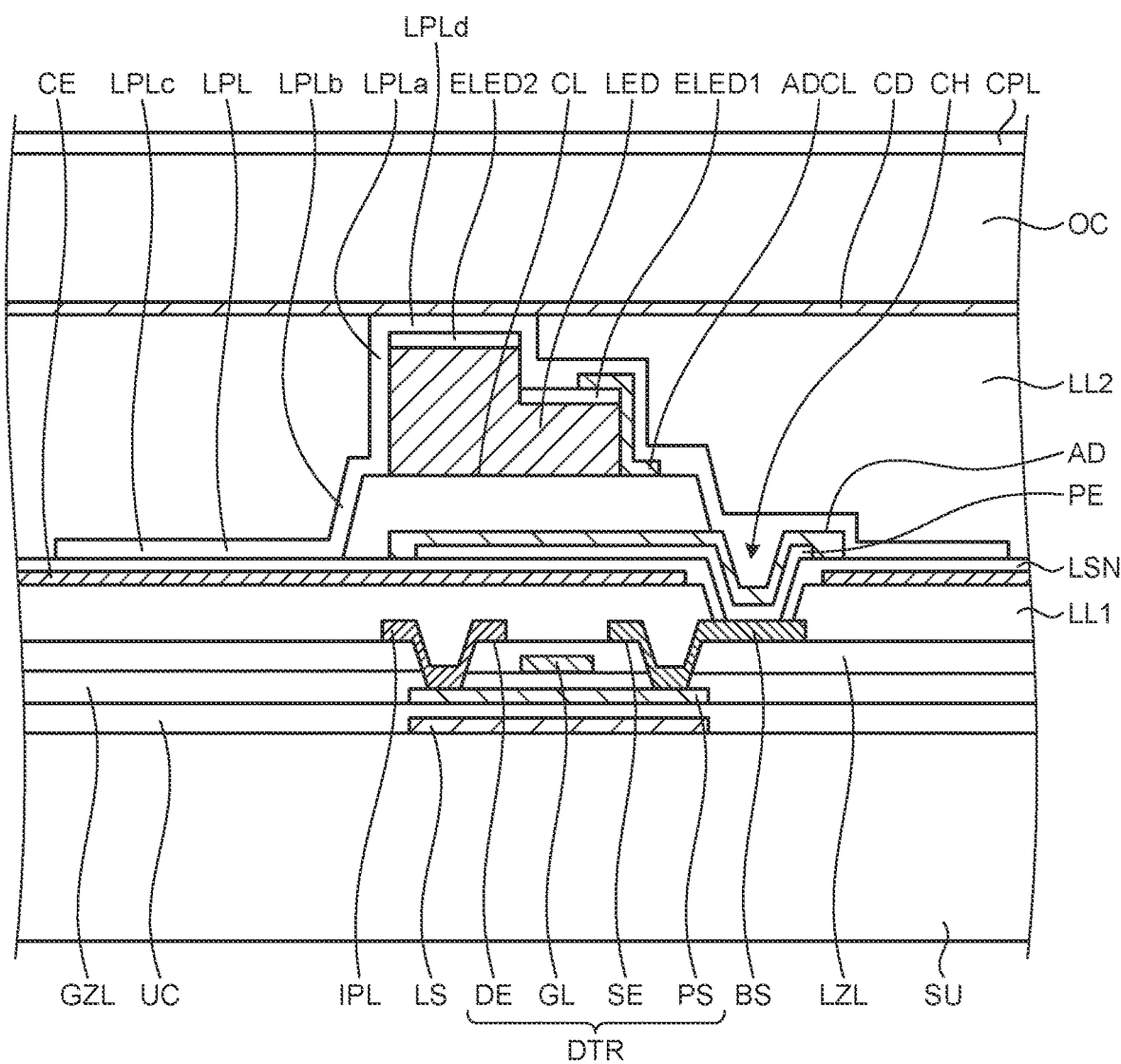
FIG. 9 is a sectional view of the display device according to a third modification of the first embodiment.

FIG. 9 is a sectional view of the display device according to a third modification of the first embodiment. While the light emitting element LED according to the first embodiment and the first and the second modifications has a vertical structure in which the light emitting element LED is coupled to the anode electrode AD at the lower part and to the cathode electrode CD at the upper part, the structure of the light emitting element LED is not limited thereto. As illustrated in FIG. 9, both the anode terminal ELED1 and the cathode terminal ELED2 according to the third modification are provided on the upper surface of the light emitting element LED. The top part LPLd of the light extraction layer LPL is provided on the anode terminal ELED1 and the cathode terminal ELED2.

The cathode terminal ELED2 is electrically coupled to the cathode electrode CD via the top part LPLd. The anode terminal ELED1 is electrically coupled to the coupling layer CL via an anode coupling layer ADCL. The anode coupling layer ADCL can be made of molybdenum tungsten alloy. Alternatively, the anode coupling layer ADCL may be a multilayered film composed of molybdenum tungsten alloy and aluminum.

As described above, the light emitting element LED may have a horizontal structure in which the anode terminal ELED1 and the cathode terminal ELED2 are disposed on the same surface.

As described above, the display device DSP according to the present embodiment includes the substrate SU, the pixels Px, the light emitting elements LED, and the inorganic insulating layer (light extraction layer LPL). The pixels Px are provided to the substrate SU. The light emitting element LED is provided to each of the pixels Px. The inorganic insulating layer (light extraction layer LPL) has translucency and covers at least part of the light emitting element LED. The inorganic insulating layer (light extraction layer LPL) includes the side part LPLa and the extending part LPLc. The side part LPLa is provided to the side surface of the light emitting element LED. The extending part LPLc is provided at a side on the lower end of the side part LPLa and extends toward the outer side of the light emitting element LED than the side part LPLa in planar view seen from the normal direction of the substrate SU.

In the display device DSP according to the present embodiment, the inorganic insulating layer (light extraction layer LPL) also includes the inclining part LPLb. The inclining part LPLb is provided between the side part LPLa and the extending part LPLc and inclines with respect to the side part LPLa.

Second Embodiment

Figure 10:
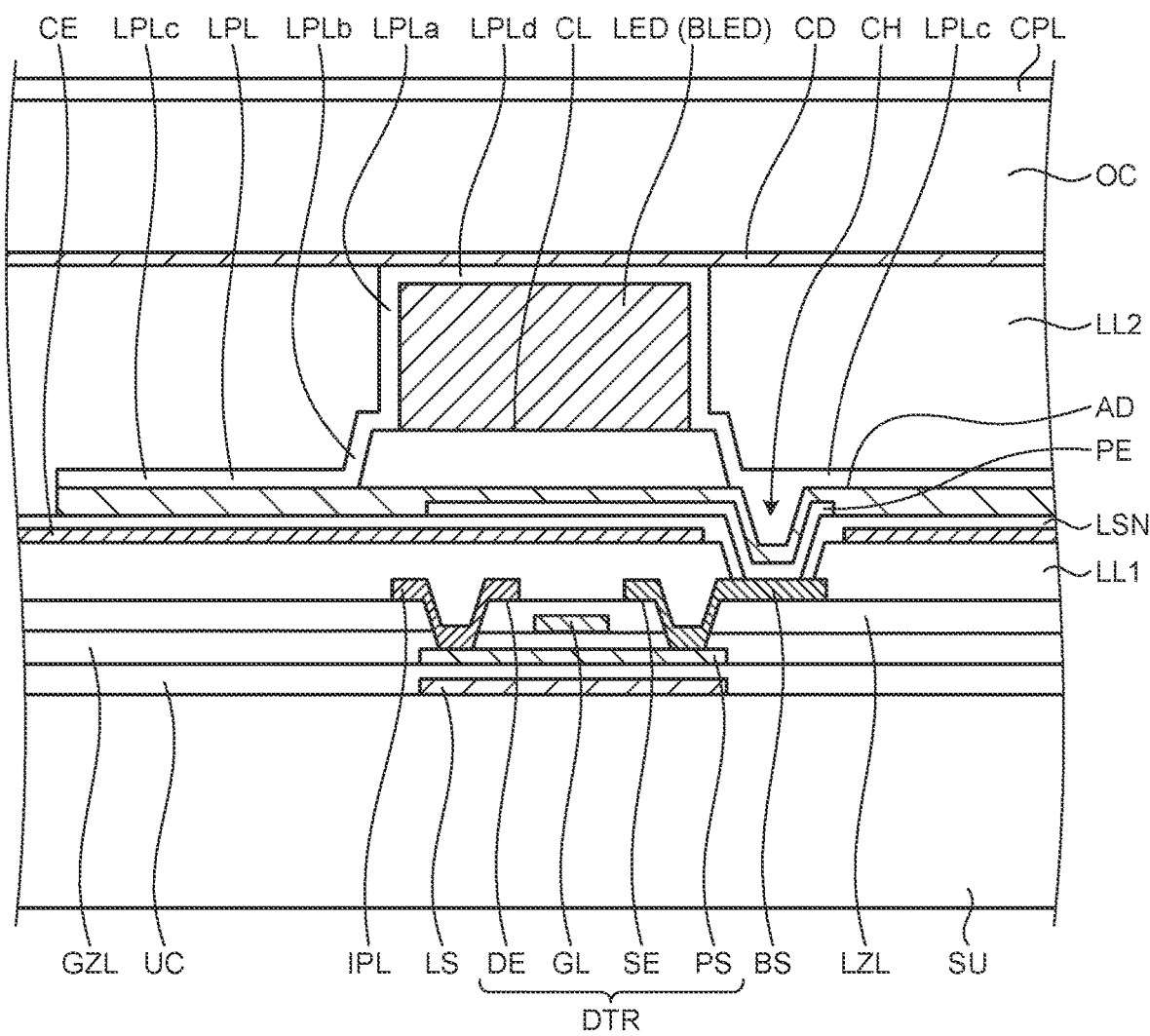
FIG. 10 is a sectional view of the display device according to a second embodiment.

FIG. 10 is a sectional view of the display device according to a second embodiment. As illustrated in FIG. 10, the anode electrode AD according to the present embodiment is provided under the light extraction layer LPL. Specifically, the anode electrode AD is provided across a region overlapping the light emitting element LED and a region not overlapping the light emitting element LED in planar view. The extending part LPLc is provided on the anode electrode AD in contact with the anode electrode AD. The anode electrode AD is provided between the capacitance nitride film LSN and the light extraction layer LPL in the normal direction of the substrate SU.

The anode electrode AD is provided in the whole region overlapping the light extraction layer LPL. In FIG. 10, the end of the anode electrode AD is disposed at the same position as that of the end of the extending part LPLc. The end of the anode electrode AD may be deviated from the end of the extending part LPLc. The end of the extending part LPLc may be disposed further away from the light emitting element LED than the anode electrode AD. Alternatively, the end of the anode electrode AD may be disposed further away from the light emitting element LED than the extending part LPLc.

The anode electrode AD includes metal material, such as silver, as described above, thereby functioning as a reflective layer. As a result, the light Lb propagating inside the extending part LPLc is reflected by the interface between the extending part LPLc and the anode electrode AD. This configuration can reduce the amount of light Lb passing through the extending part LPLc toward the lower side. Consequently, the second embodiment can increase the light extraction efficiency.

Fourth Modification of the Second Embodiment

Figure 11:
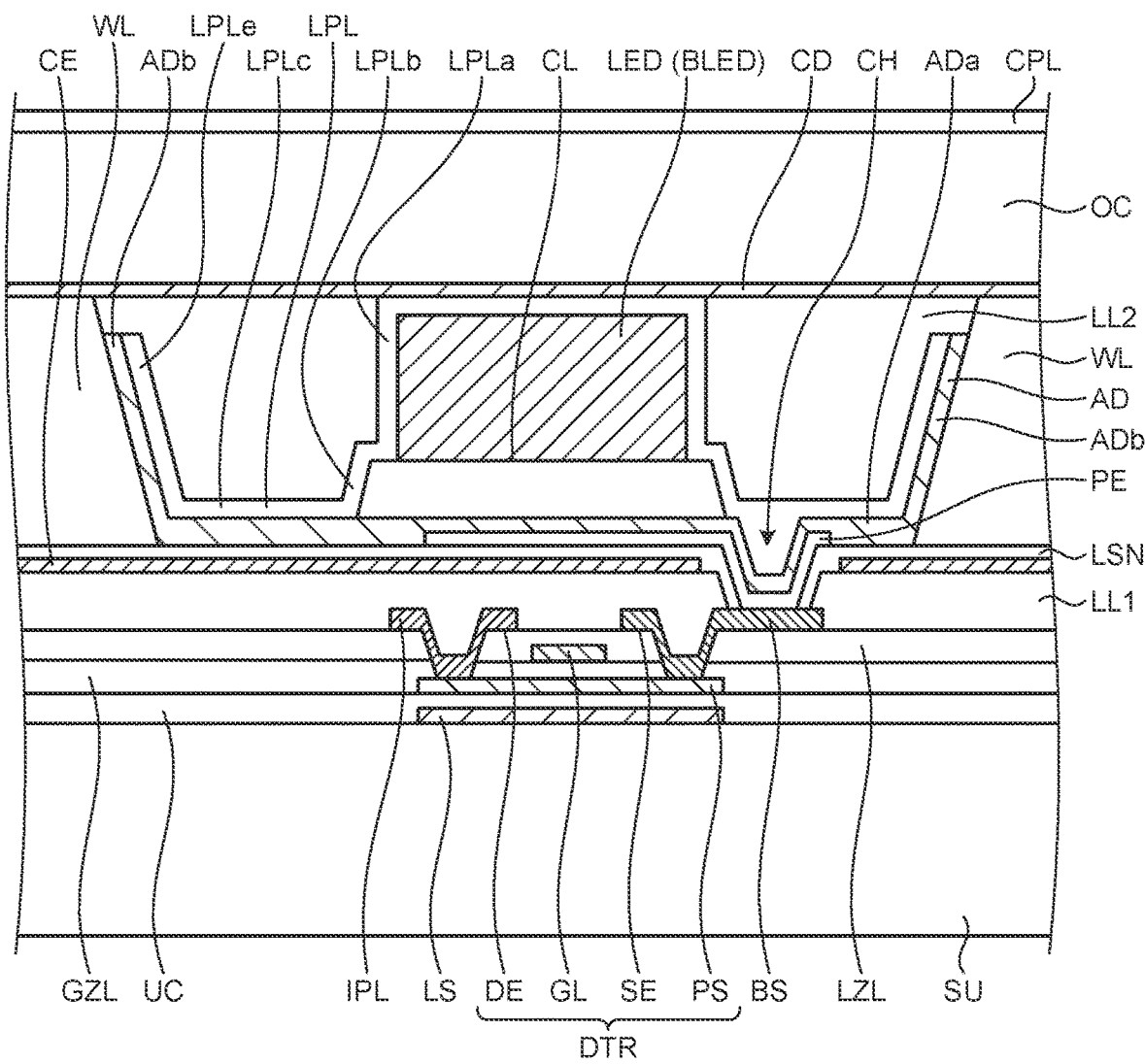
FIG. 11 is a sectional view of the display device according to a fourth modification of the second embodiment.

FIG. 11 is a sectional view of the display device according to a fourth modification of the second embodiment. As illustrated in FIG. 11, the fourth modification includes a wall structure WL facing the side surfaces of the light emitting element LED. The wall structure WL is provided on the capacitance nitride film LSN in a manner surrounding the light emitting element LED. The pixel electrode PE, the anode electrode AD, the coupling layer CL, the light emitting element LED, the light extraction layer LPL, and the second flattening layer LL2 are provided in the recess formed by the wall structure WL and the capacitance nitride film LSN. The cathode electrode CD is provided on the upper surface of the wall structure WL, the second flattening layer LL2, and the light extraction layer LPL.

The anode electrode AD has an anode electrode bottom part ADa and an anode electrode inclining part ADb. The anode electrode bottom part ADa is provided on the capacitance nitride film LSN in a region overlapping the light emitting element LED and a region overlapping the extending part LPLc. The anode electrode inclining part ADb is coupled to the end of the anode electrode bottom part ADa and provided inclining along the inner wall surface of the wall structure WL.

The light extraction layer LPL further includes a facing part LPLe. The facing part LPLe faces the side surfaces of the light emitting element LED. Specifically, the facing part LPLe is coupled to the end of the extending part LPLc and provided inclining along the inner wall surface of the wall structure WL and the anode electrode inclining part ADb. The anode electrode inclining part ADb is provided between the inner wall surface of the wall structure WL and the facing part LPLe.

The height of the anode electrode inclining part ADb and the facing part LPLe is lower than that of the wall structure WL. In other words, the upper end of the anode electrode inclining part ADb is provided away from the cathode electrode CD. While the anode electrode inclining part ADb and the facing part LPLe have the same height, the configuration is not limited thereto. The facing part LPLe may be higher than the anode electrode inclining part ADb and cover the upper end of the anode electrode inclining part ADb.

Figure 12:
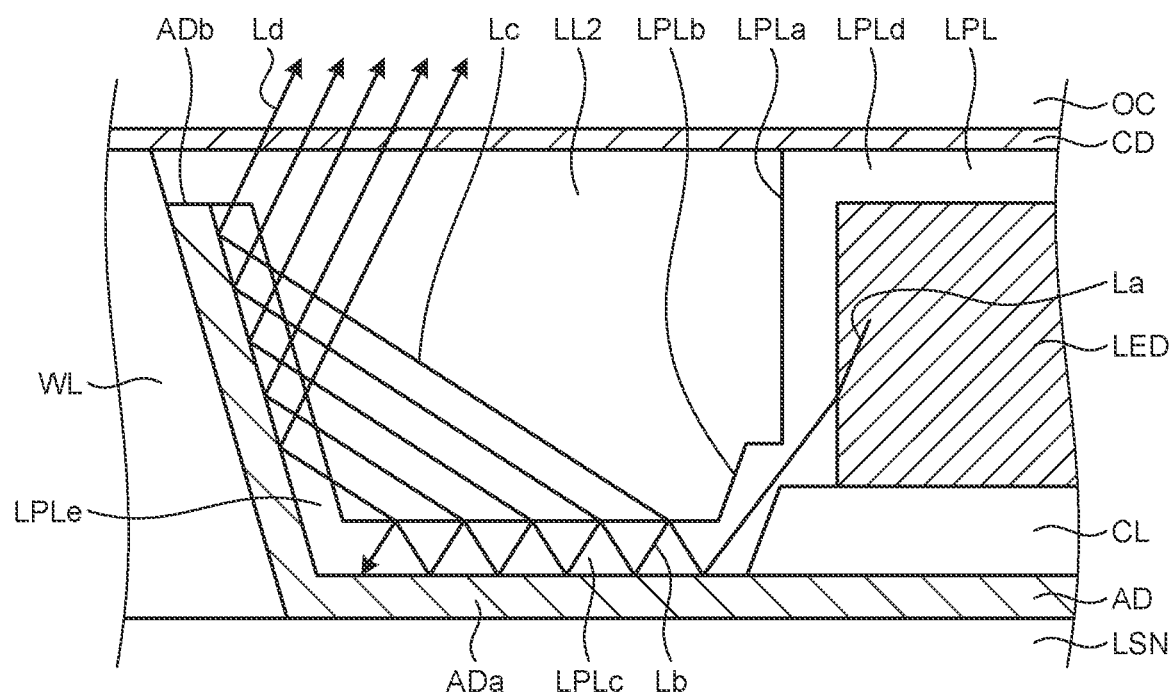
FIG. 12 is a view for explaining propagation of light in the fourth modification of the second embodiment.
Figure 13:
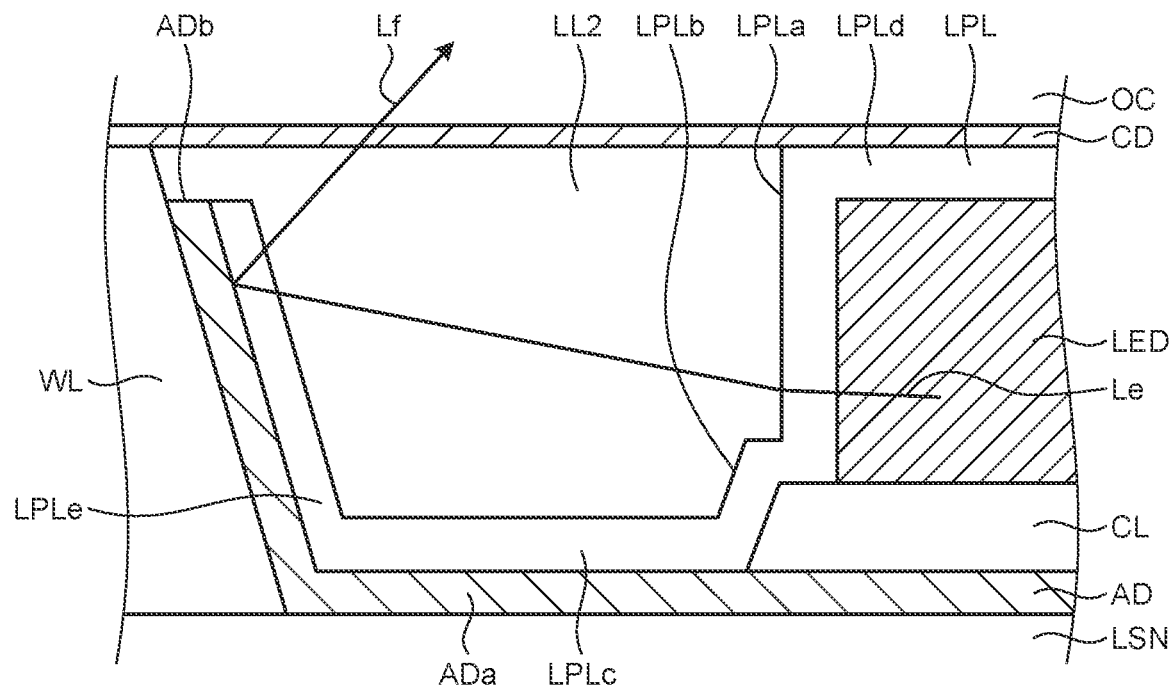
FIG. 13 is a view for explaining another example of propagation of light in the fourth modification of the second embodiment.

FIG. 12 is a view for explaining propagation of light in the fourth modification of the second embodiment. FIG. 13 is a view for explaining another example of propagation of light in the fourth modification of the second embodiment. As illustrated in FIG. 12, the light Lb propagating inside the extending part LPLc is partially output from the interface between the extending part LPLc and the second flattening layer LL2. The light Lc is output diagonally upward to the second flattening layer LL2 and travels toward the wall structure WL. Light Ld reflected by the anode electrode inclining part ADb travels upward. Consequently, the fourth modification can increase the light extraction efficiency if the light Lc output from the extending part LPLc travels at an angle nearly parallel to the surface of the substrate SU.

The light Lb may propagate from the inside of the extending part LPLc to the inside of the facing part LPLe and be output upward from the interface between the facing part LPLe and the second flattening layer LL2, which is not illustrated in FIG. 12.

As illustrated in FIG. 13, light Le output from the side surface of the light emitting element LED may possibly partially pass through the side part LPLa and be output to the second flattening layer LL2. The light Le travels toward the wall structure WL at an angle nearly parallel to the surface of the substrate SU. Light Lf reflected by the anode electrode inclining part ADb travels upward.

The fourth modification does not necessarily include the anode electrode inclining part ADb. In other words, the facing part LPLe may be coupled to the end of the extending part LPLc and provided in contact with the inner wall surface of the wall structure WL. The configurations according to the first to the third modifications of the first embodiment may be applied to the second embodiment and the fourth modification.

Third Embodiment

Figure 14:
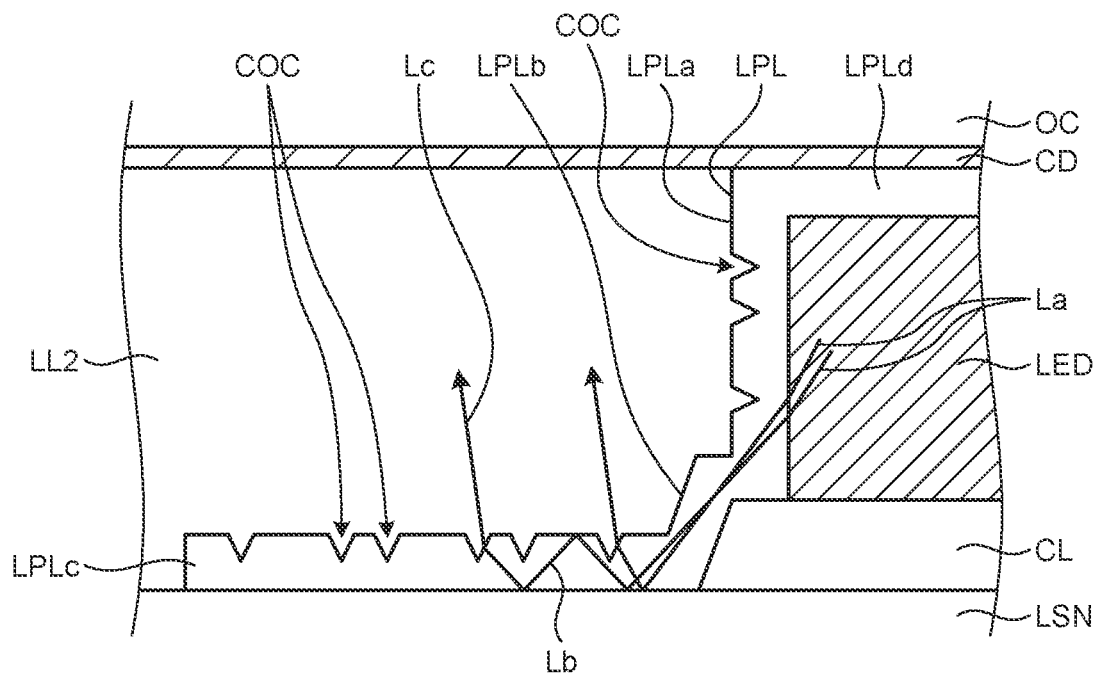
FIG. 14 is an enlarged sectional view of the light extraction layer of the display device according to a third embodiment.

FIG. 14 is an enlarged sectional view of the light extraction layer of the display device according to a third embodiment. As illustrated in FIG. 14, the surface of the light extraction layer LPL according to the third embodiment has a plurality of minute recesses COC. The recesses COC are formed in the side part LPLa and the extending part LPLc. The recesses COC may be formed in the inclining part LPLb. The recesses COC can be formed by scraping the surface of the light extraction layer LPL. The recesses COC can be formed by a method of spraying an abrasive, such as sandblast, to the light extraction layer LPL, for example.

The light Lb propagating inside the extending part LPLc is reflected in a region having no recess COC on the interface between the extending part LPLc and the second flattening layer LL2. The interface locally inclines at the part having the recess COC, and the incident angle of the light Lb at the part having the recess COC is different from that in the region having no recess COC. As a result, the light Lc is efficiently output to the second flattening layer LL2.

Fifth Modification of the Third Embodiment

Figure 15:
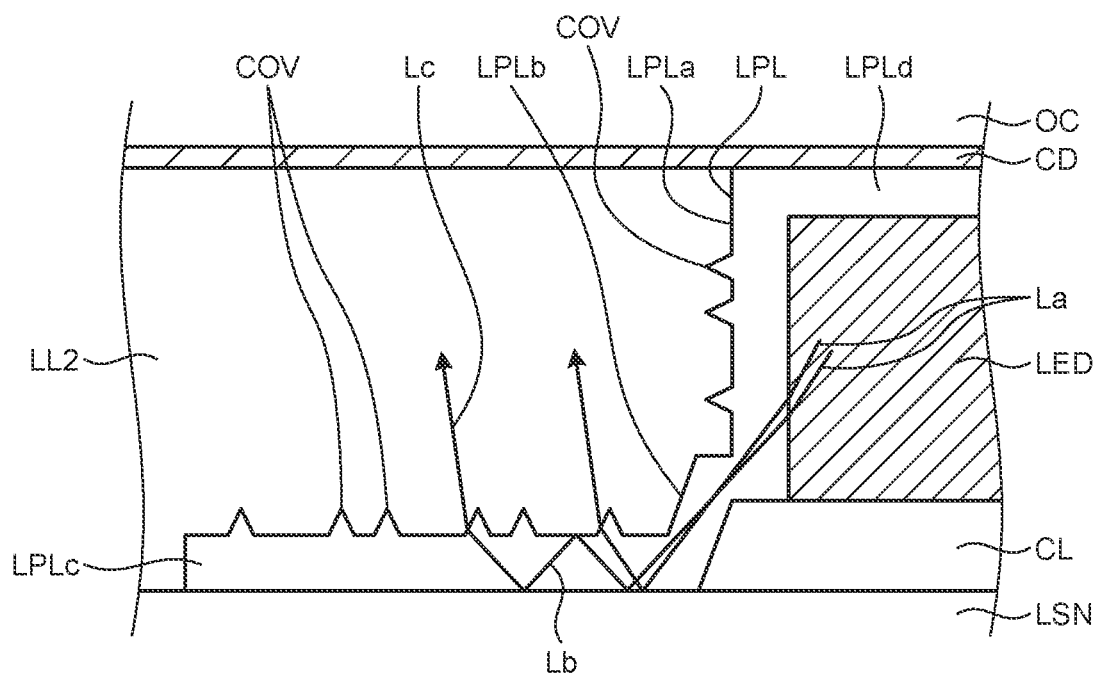
FIG. 15 is an enlarged sectional view of the light extraction layer of the display device according to a fifth modification of the third embodiment.

FIG. 15 is an enlarged sectional view of the light extraction layer of the display device according to a fifth modification of the third embodiment. As illustrated in FIG. 15, the surface of the light extraction layer LPL according to the fifth modification of the third embodiment has a plurality of minute protrusions COV. The protrusions COV are formed on the side part LPLa and the extending part LPLc. The protrusions COV may be formed on the inclining part LPLb. The protrusions COV can be formed by adhering the same material as that of the light extraction layer LPL, such as minute particles of titanium oxide, to the light extraction layer LPL. More specifically, the protrusions COV are formed by: mixing minute particles of titanium oxide in the organic material of the second flattening layer LL2 to form the second flattening layer LL2, and causing part of the minute particles in the second flattening layer LL2 to adhere to the surface of the light extraction layer LPL.

Also in the fifth modification, the interface locally inclines at the part having the protrusion COV, and the incident angle of the light Lb at the part having the protrusion COV is different from that in the region having no protrusion COV. As a result, the light Lc is efficiently output to the second flattening layer LL2. The configuration is not limited to those illustrated in FIGS. 14 and 15, and the surface of the light extraction layer LPL may have a plurality of minute recesses and protrusions. Specifically, the recesses and protrusions may be formed by roughening the surface of the light extraction layer LPL by reverse sputtering, for example.

The configurations according to the first to the third modifications of the first embodiment and the configurations according to the second embodiment and the fourth modification may be applied to the third embodiment and the fifth modification. In the fourth modification, for example, the recesses COC, the protrusions COV, or the recesses and protrusions may be formed on the surface of the facing part LPLe illustrated in FIG. 11.

Fourth Embodiment

Figure 16:
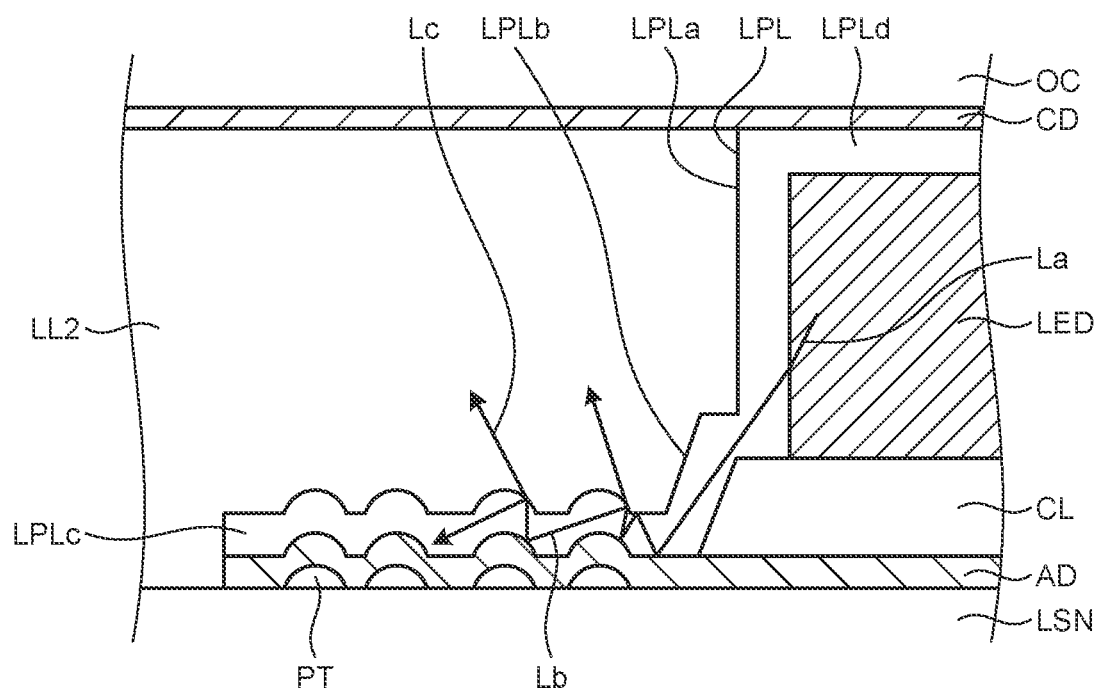
FIG. 16 is an enlarged sectional view of the light extraction layer of the display device according to a fourth embodiment.

FIG. 16 is an enlarged sectional view of the light extraction layer of the display device according to a fourth embodiment. As illustrated in FIG. 16, the fourth embodiment has a plurality of protrusion structures PT on the capacitance nitride film LSN. The protrusion structures PT can be formed by patterning an organic resist on the capacitance nitride film LSN. The protrusion structures PT are then heated, so that the organic resist melts and solidifies. As a result, each of the protrusion structures PT has a semicircular sectional structure with a curved surface.

The anode electrode AD and the extending part LPLc are provided on the capacitance nitride film LSN and the protrusion structures PT. The part of the anode electrode AD overlapping the extending part LPLc has a plurality of protrusions along the shape of the protrusion structures PT. The surface of the extending part LPLc also has a plurality of protrusions along the shape of the protrusion structures PT.

With this structure, the interface between the anode electrode AD and the extending part LPLc locally inclines at the parts having the protrusions, and the reflection angle of the light Lb differs. As a result, the reflection angle of the light Lb differs between the parts having the protrusions and the parts not having the protrusions, and the traveling direction of the light Lb changes. This structure increases the component of the light Lb traveling in the normal direction of the interface between the extending part LPLc and the second flattening layer LL2, thereby enabling the light Lc to pass through the second flattening layer LL2. The interface between the extending part LPLc and the second flattening layer LL2 also locally inclines at the parts having the protrusions. The incident angle of the light Lb differs between the parts having the protrusions and the parts not having the protrusions. As a result, the light Lc is efficiently output to the second flattening layer LL2.

Sixth Modification of the Fourth Embodiment

Figure 17:
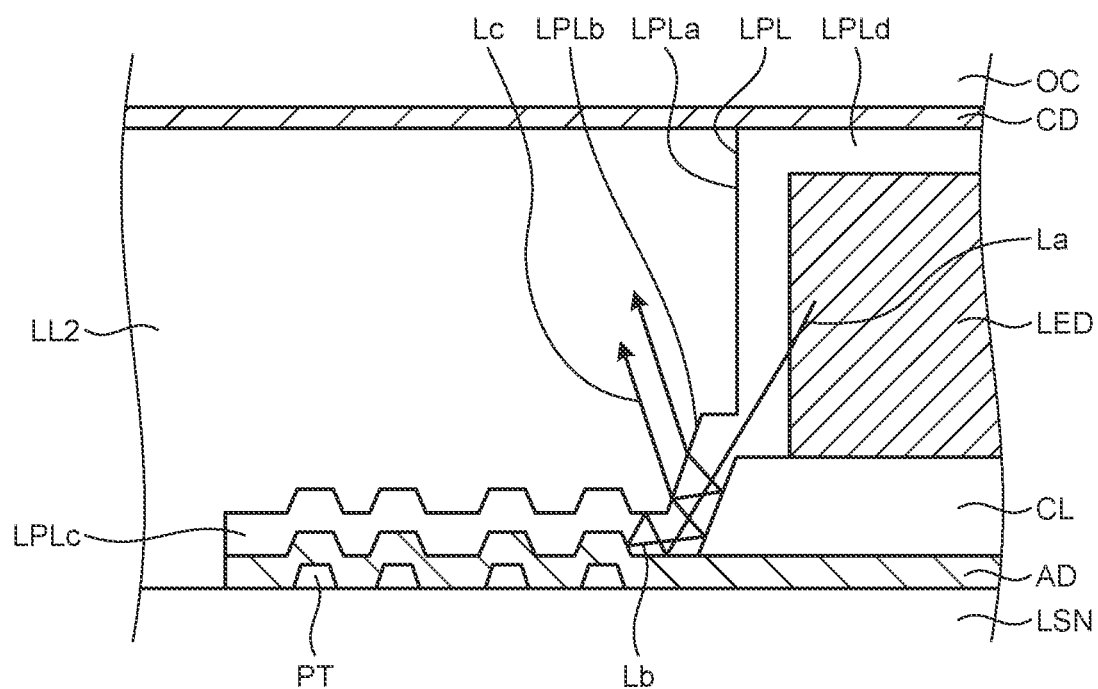
FIG. 17 is an enlarged sectional view of the light extraction layer of the display device according to a sixth modification of the fourth embodiment.

FIG. 17 is an enlarged sectional view of the light extraction layer of the display device according to a sixth modification of the fourth embodiment. As illustrated in FIG. 17, the protrusion structures PT on the capacitance nitride film LSN according to the sixth modification of the fourth embodiment each have a trapezoidal sectional structure. The protrusion structure PT can be formed by heating at a temperature lower than the melting temperature of the organic resist.

Also in the sixth modification, the anode electrode AD and he extending part LPLc have a plurality of protrusions along the shape of the protrusion structures PT. The light Lb is partially reflected by the side surface of the protrusion formed on the anode electrode AD and changes its traveling direction. The light Lb reflected by the side surface of the protrusion is further reflected by the surface of the coupling layer CL. The light Lc is then output upward from the inclining part LPLb. To simplify the drawing, FIG. 17 does not illustrate the light Lb traveling inside the extending part LPLc. Also in the sixth modification, the light Lc is efficiently output to the second flattening layer LL2 with the protrusions formed on the anode electrode AD and the extending part LPLc similarly to the fourth embodiment.

The configurations according to the first to the third modifications of the first embodiment and the configurations according to the second embodiment and the fourth modification may be applied to the fourth embodiment and the sixth modification.

Fifth Embodiment

Figure 18:
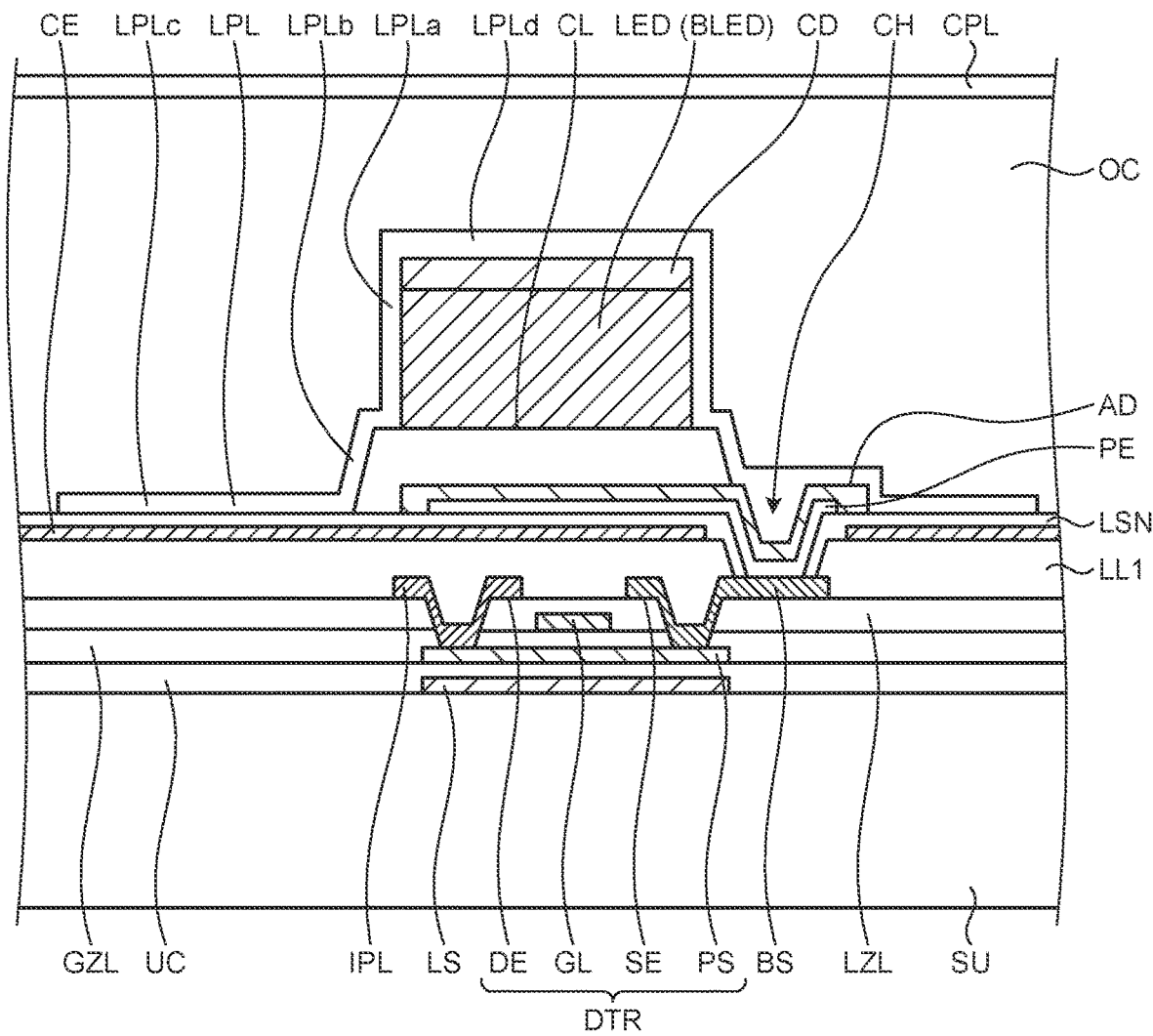
FIG. 18 is a sectional view of the display device according to a fifth embodiment.
Figure 19:
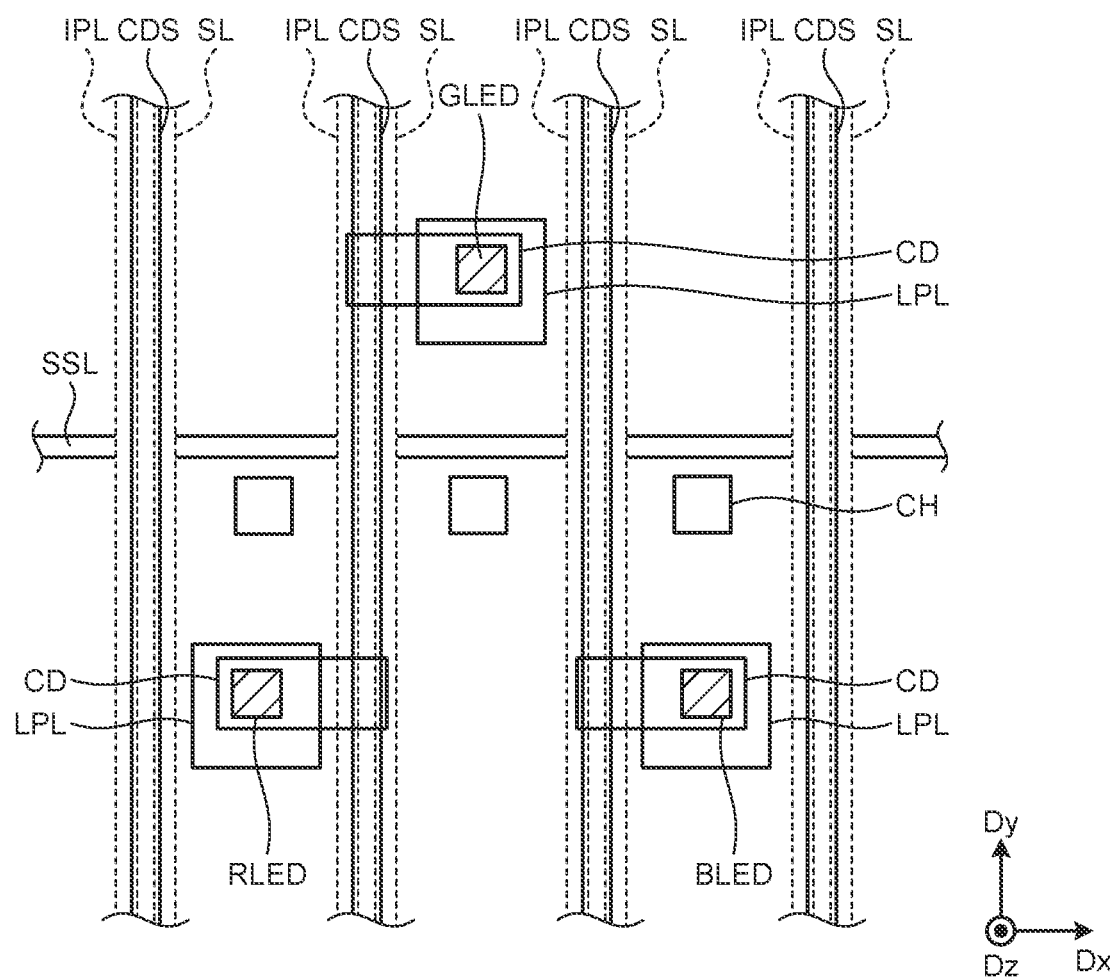
FIG. 19 is a plan view of a plurality of pixels in the display device according to the fifth embodiment.

FIG. 18 is a sectional view of the display device according to a fifth embodiment. FIG. 19 is a plan view of a plurality of pixels in the display device according to the fifth embodiment. As illustrated in FIG. 18, the cathode electrode CD and the light extraction layer LPL according to the fifth embodiment are stacked in order on the light emitting element LED. In other words, the top part LPLd is provided on the cathode electrode CD, and the side part LPLa covers the side surfaces of the light emitting element LED and the cathode electrode CD. The overcoat layer OC is provided on the capacitance nitride film LSN to cover the light extraction layer LPL.

As illustrated in FIG. 19, the cathode electrodes CD are provided to the respective light emitting elements LED (RLED, GLED, and BLED). The cathode electrode CD is electrically coupled to a cathode coupling line CDS. The cathode electrode CD is electrically coupled to the cathode electrodes CD provided to other light emitting elements LED via the cathode coupling line CDS. With this configuration, a plurality of light emitting elements LED are supplied with the common cathode power supply potential PVSS.

In the present embodiment, the cathode electrode CD is formed on the light emitting element LED by patterning, and the light extraction layer LPL is then formed to cover the cathode electrode CD and the light emitting element LED. In this case, the process of forming the light extraction layer LPL is the last process in a vacuum process. To form a plurality of minute recesses COC (refer to FIG. 14) on the surface of the light extraction layer LPL as described in the third embodiment, the recesses COC can be formed by a method of spraying an abrasive, such as sandblast, to the light extraction layer LPL, for example. After the polishing, it is necessary to perform cleaning for removing the abrasive and the shavings of the light extraction layer LPL. In the present embodiment, there is no vacuum process after the formation of the light extraction layer LPL. Consequently, the cleaning can be performed in a simpler manner if the light extraction layer LPL is subjected to processing, such as forming the recesses COC.

The cathode electrode CD is also provided to part of the side surface of the light emitting element LED to be coupled to the cathode coupling line CDS. In this case, the side surface of the light emitting element LED inclines to have a trapezoidal sectional shape, thereby preventing the cathode electrode CD from breaking. The configurations according to the first to the fourth embodiments and the first to the sixth modifications may be applied to the fifth embodiment.

Sixth Embodiment

Figure 20:
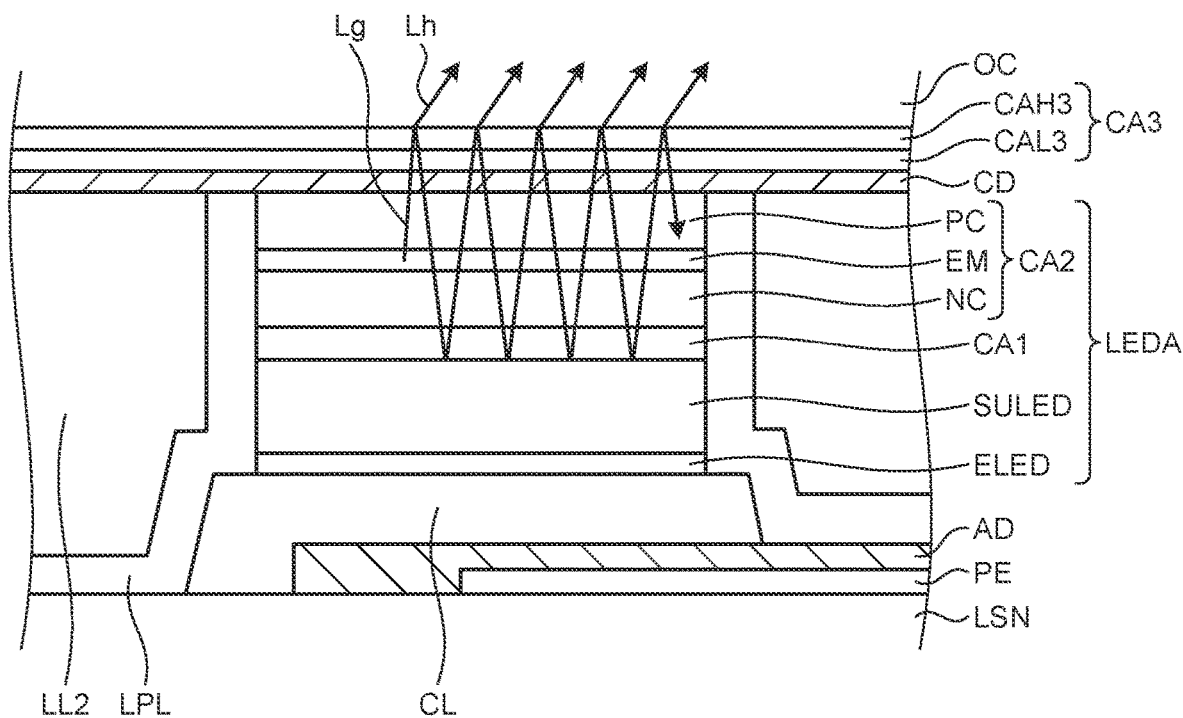
FIG. 20 is a sectional view of the display device according to a sixth embodiment.

FIG. 20 is a sectional view of the display device according to a sixth embodiment. As illustrated in FIG. 20, the display device DSP according to the sixth embodiment further includes a first resonant layer CA1, a second resonant layer CA2, and a third resonant layer CA3. The first resonant layer CA1 and the second resonant layer CA2 are provided in a light emitting element LEDA. Specifically, the first resonant layer CA1 is provided between the light emitting element substrate SULED and the n-type cladding layer NC. The first resonant layer CA1 is one dielectric layer. The material of the first resonant layer CA1 may be a silicon oxide film having a low refractive index. The layer thickness of the first resonant layer CA1 in the red light emitting element RLED is approximately 216 nm, that in the green light emitting element GLED is approximately 174 nm, and that in the blue light emitting element BLED is approximately 154 nm.

The second resonant layer CA2 is obtained by adjusting the layer thickness of the n-type cladding layer NC, the light emitting layer EM, and the p-type cladding layer PC. The layer thickness of the second resonant layer CA2 is a value obtained by dividing one-half of the main emission wavelength of light emitted from the light emitting element LEDA by the refractive index. In other words, when the layer thickness of the second resonant layer CA2 is $d_2$, the main emission wavelength of light emitted from the light emitting element LEDA is $\lambda$, and the refractive index of the second resonant layer CA2 is $n_2$, the layer thickness $d_2$ is expressed by Expression (2):

$$d_2 = i\lambda/2n_2 \quad (2)$$

where i is a positive integer.

The third resonant layer CA3 is provided on the light emitting element LEDA and the light extraction layer LPL. The cathode electrode CD, the third resonant layer CA3, and the overcoat layer OC are stacked in order on the light emitting element LEDA. The present embodiment does not include the top part LPLd of the light extraction layer LPL similarly to the first modification of the first embodiment illustrated in FIG. 7.

The third resonant layer CA3 include one low refractive index dielectric layer CAL3 and one high refractive index dielectric layer CAH3. The low refractive index dielectric layer CAL3 is a silicon oxide film having the same thickness as that of the first resonant layer CA1. The high refractive index dielectric layer CAH3 is made of titanium oxide. The layer thickness of the high refractive index dielectric layer CAH3 in the red light emitting element RLED is approximately 108 nm, that in the green light emitting element GLED is approximately 86 nm, and that in the blue light emitting element BLED is approximately 76 nm.

The resonator structure according to the present embodiment is composed of the first resonant layer CA1 and the second resonant layer CA2 provided in the light emitting element LEDA and the third resonant layer CA3 provided outside the light emitting element LEDA. With this configuration, light Lg output upward from the light emitting layer EM is incident on the third resonant layer CA3. Partial light Lh of the light Lg passes through the third resonant layer CA3 and is output to above the light emitting element LEDA, and other partial light returns to the light emitting layer EM. The light returning to the light emitting layer EM is reflected by the first resonant layer CA1. The light Lg is repeatedly reflected a plurality of times between the third resonant layer CA3 and the first resonant layer CA1.

A layer thickness $d_3$ of the low refractive index dielectric layer CAL3 or the high refractive index dielectric layer CAH3 of the third resonant layer CA3 is expressed by Expression (3):

$$d_3 = i\mu/2n_3 \quad (3)$$

where $n_3$ is the refractive index of the low refractive index dielectric layer CAL3 or the high refractive index dielectric layer CAH3.

Light rays reflected by the interfaces are in phase and intensify each other. Accordingly, the emission intensity of the light Lg reflected by the first resonant layer CA1 and the third resonant layer CA3 and output upward increases.

The layer thickness $d_3$ of the low refractive index dielectric layer CAL3 and the high refractive index dielectric layer CAH3 is obtained when i=1 is satisfied in Expression (3). As i becomes larger, the incident angle dependence and the emission wavelength dependence of the light Lh output from the resonator structure becomes steeper. As a result, the emission component in the normal direction increases, and the half width decreases. Consequently, the display device DSP has higher color purity. As i becomes larger, however, it is necessary to make the layer thickness of the resonator structure larger, resulting in an increase in the manufacturing cost. For this reason, i is preferably set to 1.

Seventh Modification of the Sixth Embodiment

Figure 21:
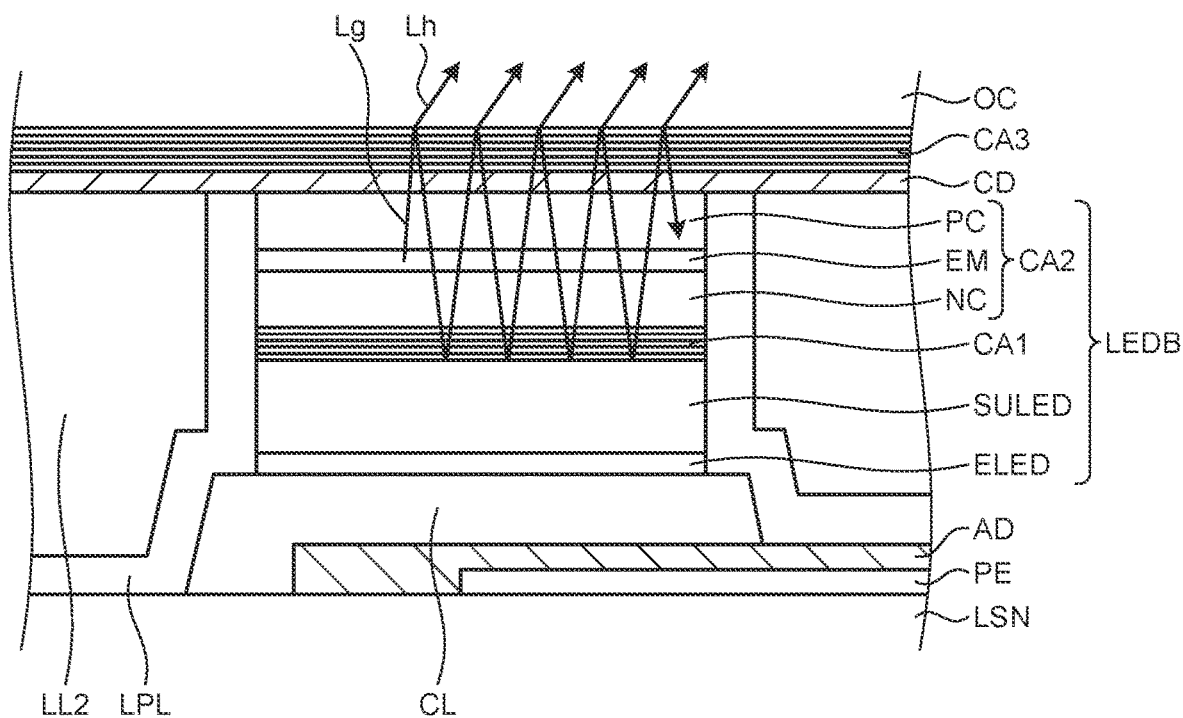
FIG. 21 is a sectional view of the display device according to a seventh modification of the sixth embodiment.

FIG. 21 is a sectional view of the display device according to a seventh modification of the sixth embodiment. As illustrated in FIG. 21, a light emitting element LEDB according to the seventh modification of the sixth embodiment includes the first resonant layer CA1 composed of five dielectric layers. In the first resonant layer CA1, the dielectric layers are stacked on the light emitting element substrate SULED in order of a low refractive index layer, a high refractive index layer, a low refractive index layer, a high refractive index layer, and a low refractive index layer. The third resonant layer CA3 is composed of six dielectric layers. In the third resonant layer CA3, the dielectric layers are stacked on the cathode electrode CD in order of a low refractive index layer, a high refractive index layer, a low refractive index layer, a high refractive index layer, a low refractive index layer, and a high refractive index layer. The high refractive index layer is provided as the uppermost layer of the third resonant layer CA3.

Figure 22:
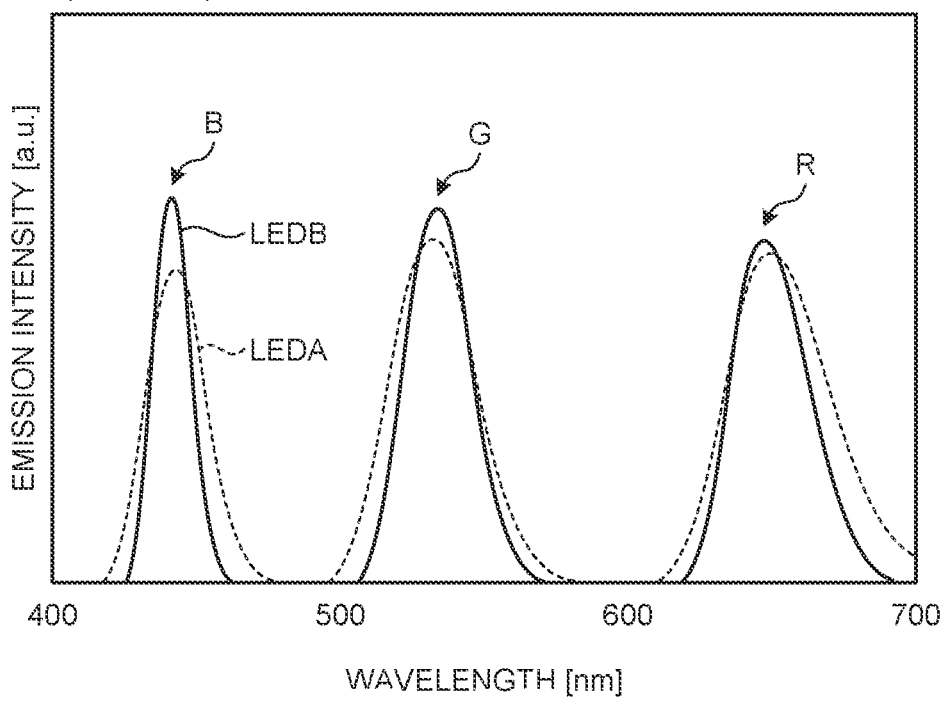
FIG. 22 is a graph of the relation between wavelength and emission intensity in the display device according to the sixth embodiment and the seventh modification.
Figure 23:
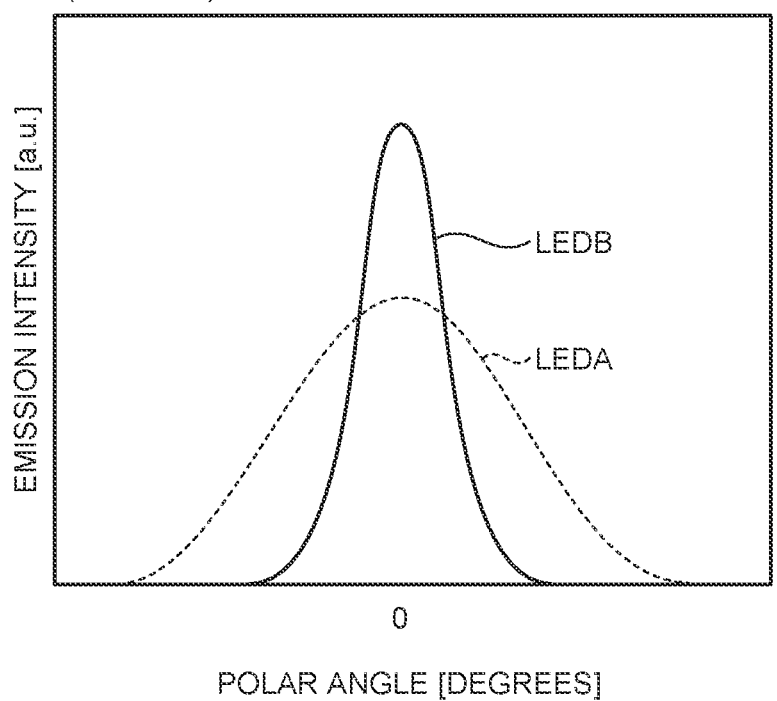
FIG. 23 is a graph of the relation between polar angle and emission intensity in the display device according to the sixth embodiment and the seventh modification.

FIG. 22 is a graph of the relation between wavelength and emission intensity in the display device according to the sixth embodiment and the seventh modification. FIG. 23 is a graph of the relation between polar angle and emission intensity in the display device according to the sixth embodiment and the seventh modification. Graph 1 in FIG. 22 indicates the emission spectrum of light emitted from the light emitting element LEDA according to the sixth embodiment and the emission spectrum of light emitted from the light emitting element LEDB according to the seventh modification in comparison. As illustrated in FIG. 22, the display device DSP including the light emitting element LEDB has higher intensity of the emission spectrum and a smaller half width in all the wavelengths of red (R), green (G), and blue (B) than the display device DSP including the light emitting element LEDA.

As represented by Graph 2 in FIG. 23, the display device DSP including the light emitting element LEDB has higher emission intensity in the normal direction (polar angle of 0 degrees) than the display device DSP including the light emitting element LEDA. By increasing the number of layers of the first resonant layer CA1 and the third resonant layer CA3, the display device DSP has higher emission intensity and a smaller half width in the normal direction and can display brighter light color. Consequently, the display device DSP can achieve higher display performance in the normal direction in which a user more frequently observes the display device DSP when using it. The polar angle is an angle formed by the normal direction of the substrate SU and the traveling direction of the output light.

Eight Modification of the Sixth Embodiment

Figure 24:
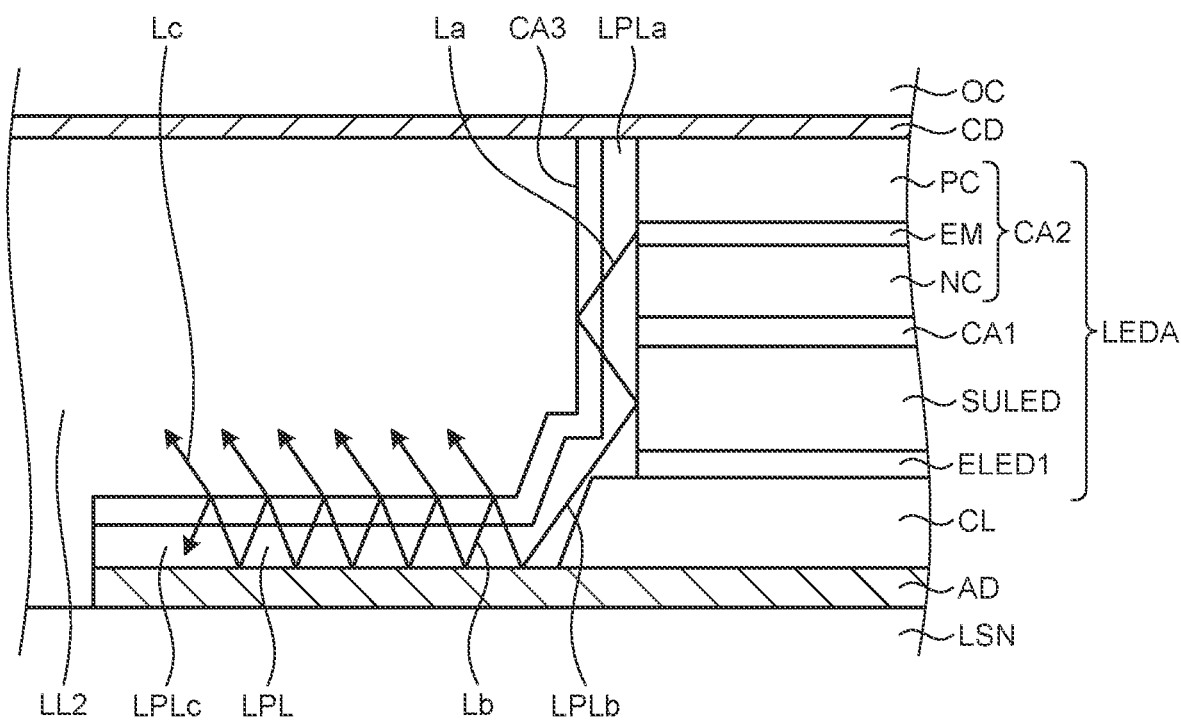
FIG. 24 is an enlarged sectional view of the light extraction layer and a third resonant layer of the display device according to an eighth modification of the sixth embodiment.

FIG. 24 is an enlarged sectional view of the light extraction layer and the third resonant layer of the display device according to an eighth modification of the sixth embodiment. As illustrated in FIG. 24, the third resonant layer CA3 according to the eighth modification is provided overlapping the light extraction layer LPL. Specifically, the third resonant layer CA3 is provided overlapping the side part LPLa, the inclining part LPLb, and the extending part LPLc. Similarly to the sixth embodiment illustrated in FIG. 20, the first resonant layer CA1 and the second resonant layer CA2 are provided in the light emitting element LEDA.

The anode electrode AD is provided in a region overlapping the extending part LPLc. In other words, the anode electrode AD, the extending part LPLc, and the third resonant layer CA3 are stacked in order on the capacitance nitride film LSN. In the eighth modification, the part in which the anode electrode AD, the extending part LPLc, and the third resonant layer CA3 overlap also functions as a resonator structure. In other words, the anode electrode AD also functions as the first resonant layer CA1. The anode electrode AD has a multilayered structure made of metal material and a dielectric layer, and the dielectric layer has the same layer thickness as that of the first resonant layer CA1.

The extending part LPLc also functions as the second resonant layer CA2. The layer thickness of the extending part LPLc in the red light emitting element RLED is approximately 216 nm, the layer thickness of the extending part LPLc in the green light emitting element GLED is approximately 172 nm, and the layer thickness of the extending part LPLc in the blue light emitting element BLED is approximately 152 nm. These values are obtained when i=2 is satisfied in Expression (2). The extending part LPLc is preferably thickened considering the light injection efficiency to the light extraction layer LPL.

The light La output from the side surface of the light emitting element LEDA is incident on the side part LPLa and propagates inside the light extraction layer LPL and the third resonant layer CA3. The light Lb propagating in the extending part LPLc is repeatedly reflected between the third resonant layer CA3 and the anode electrode AD and is partially output to the second flattening layer LL2. The resonator structure composed of the anode electrode AD, the extending part LPLc, and the third resonant layer CA3 increases the emission intensity of the light Lc output to the second flattening layer LL2 and decreases the half width. Consequently, the display device DSP has higher extraction efficiency of the light La output from the side surface of the light emitting element LEDA and can achieve higher display performance.

The number of layers and the thickness of the resonant layers according to the sixth embodiment and the seventh and the eighth modifications are given by way of example only and may be appropriately modified. The third resonant layer CA3 according to the seventh modification, for example, may have five or less layers or seven or more layers. The configurations according to the first to the fourth embodiments and the first to the sixth modifications may be applied to the sixth embodiment and the seventh and the eighth modifications.

While an exemplary embodiment according to the present invention has been described, the embodiment is not intended to limit the invention. The contents disclosed in the embodiment are given by way of example only, and various changes may be made without departing from the spirit of the present invention. Appropriate changes made without departing from the spirit of the present invention naturally fall within the technical scope of the invention. At least one of various omissions, substitutions, and changes of the components may be made without departing from the gist of the embodiment above and the modifications thereof.

What is claimed is:

1. A display device comprising:
a substrate;
a plurality of pixels provided to the substrate;
a light emitting element provided to each of the pixels;
a nitride film arranged below the light emitting element;
an anode electrode electrically connected to the light emitting element;
an inorganic insulating layer having translucency and covering at least part of the light emitting element;
a flatting layer covering the inorganic insulating layer; and
a cathode electrode electrically connected to the light emitting element, wherein the inorganic insulating layer includes:
  a side part provided between a side surface of the light emitting element and the flatting layer;
  an extending part extending toward an outer side of the light emitting element than the side part in planar view seen from a normal direction of the substrate; and
  an inclining part provided between the side part and the extending part and inclining with respect to the side part,
the nitride film, the anode electrode, the extending part, and the flatting layer that is in direct contact with the side part, are stacked in this order from the substrate side,
the flatting layer is in direct contact with the upper surface of the extending part,
a refractive index of the inorganic insulating layer is larger than a refractive index of the flattening layer and a refractive index of the nitride film, and
a difference between refractive index of the inorganic insulating layer and refractive index of the light emitting element is smaller than a difference between refractive of the flattening layer and refractive index of the light emitting element.

2. The display device according to claim 1, further comprising:
a coupling layer provided between the light emitting element and the substrate and electrically coupled to the light emitting element, wherein
the inclining part is provided along a side surface of the coupler.

3. The display device according to claim 1, wherein:
the cathode electrode is provided on the flattening layer, wherein
the inorganic insulating layer includes a top part coupled to an upper end of the side part and provided between an upper surface of the light emitting element and the cathode electrode.

4. The display device according to claim 1, wherein:
the cathode electrode is provided on the flattening layer and electrically coupled to an upper surface of the light emitting element, and
the inorganic insulating layer has an opening at a part overlapping the upper surface of the light emitting element.

5. The display device according to claim 1, wherein
the inorganic insulating layer includes a facing part coupled to the extending part and provided along a wall surface of the wall structure, and
the anode electrode is provided between the wall surface of the wall structure and the facing part.

6. The display device according to claim 5, further comprising:
a wall structure facing a side surface of the light emitting element, wherein
the inorganic insulating layer includes a facing part coupled to the extending part and provided along a wall surface of the wall structure, and
the anode electrode is provided between the wall surface of the wall structure and the facing part.

7. The display device according to claim 1, further comprising:
a wall structure facing a side surface of the light emitting element, wherein
the inorganic insulating layer includes a facing part coupled to the extending part and provided along a wall surface of the wall structure.

* * * * *